US012243933B2

(12) United States Patent
Rahimo et al.

(10) Patent No.: US 12,243,933 B2
(45) Date of Patent: Mar. 4, 2025

(54) SEMICONDUCTOR DEVICE LAYOUTS

(71) Applicant: mqSemi AG, Zug (CH)

(72) Inventors: Munaf Rahimo, Gaensbrunnen (CH);
Iulian Nistor, Niederweningen (CH)

(73) Assignee: mqSemi AG, Zug (CH)

( * ) Notice: Subject to any disclaimer, the term of this patent is extended or adjusted under 35 U.S.C. 154(b) by 453 days.

(21) Appl. No.: 17/570,198

(22) Filed: Jan. 6, 2022

(65) Prior Publication Data

US 2022/0216331 A1  Jul. 7, 2022

(30) Foreign Application Priority Data

Jan. 6, 2021 (GB) ...................................... 2100130

(51) Int. Cl.
*H01L 29/739* (2006.01)
*H01L 29/10* (2006.01)

(52) U.S. Cl.
CPC ...... *H01L 29/7397* (2013.01); *H01L 29/1095* (2013.01)

(58) Field of Classification Search
CPC ............. H01L 29/7397; H01L 29/1095; H01L 29/1608; H01L 29/2203; H01L 29/4238; H01L 29/7395; H01L 29/0696; H01L 29/0834; H01L 29/66325
USPC ....................................................... 257/288
See application file for complete search history.

(56) References Cited

U.S. PATENT DOCUMENTS

| | | | | |
|---|---|---|---|---|
| 2010/0276728 A1* | 11/2010 | Hsieh | .................. | H01L 29/0865 257/E29.198 |
| 2012/0187419 A1* | 7/2012 | Elpelt | ................. | H01L 29/7802 257/77 |
| 2014/0332845 A1* | 11/2014 | Bobde | ................. | H01L 29/4238 438/138 |

FOREIGN PATENT DOCUMENTS

GB    2585696 A    1/2021

OTHER PUBLICATIONS

GB Search and Examination Report dated Feb. 23, 2021 for GB Application No. 2100130.0.

* cited by examiner

*Primary Examiner* — Duy T Nguyen
(74) *Attorney, Agent, or Firm* — Tarolli, Sundheim, Covell & Tummino LLP

(57) ABSTRACT

A semiconductor device with an active transistor cell comprising a p-type first and second base layers, surrounding an n-type source region, the device further comprising a plurality of first gate electrodes embedded in trench recesses, has additional gate runners formed adjacent to the first base layer, outside the active cell, and contacting the first gate electrodes at the cross points thereof. The additional gate runners do not affect the active cell design in terms of cell pitch i.e., the design rules for cell spacing, hole drainage between the cells, or gate-collector capacitance, hence resulting in optimum low conduction and switching losses. The transistor cell and layout designs offer a range of advantages both in terms of performance and manufacturability, with the potential of applying additional layers or structures.

19 Claims, 36 Drawing Sheets

SEMICONDUCTOR DEVICE LAYOUTS

CROSS-REFERENCE TO RELATED APPLICATIONS

The present application claims priority to GB Patent Application No. 2100130.0 filed on 6 Jan. 2021. The entirety of this application is hereby incorporated by reference for all purposes.

TECHNICAL FIELD

The invention relates to the field of semiconductor devices. More particularly it relates to a semiconductor device with multiple transistor unit cells, comprising layers of different conductivity types.

BACKGROUND

Improving the electrical performance of semiconductors based on Metal Oxide Semiconductor interfaces and respective inversion or depletion layer channels requires the miniaturization of dimensions at transistor cell level, combined with preserving a reasonable large channel width, to reduce losses. In particular, for power semiconductors like IGBTs and MOSFETs, various transistor active cell designs have been proposed with the goal of improving the electron-hole concentration (plasma concentration) in the device. For Silicon IGBTs, typical Planar and Trench active cell designs are shown in FIGS. 1C and 3B. Both designs can incorporate an enhancement n-type layer for improved plasma concentration as shown in FIG. 1D for a planar type cell.

The basic transistor active cell can have a cellular design as depicted in a top view plane of FIG. 1A, or a strip design as depicted in FIG. 1B. A fully functional device will be obtained by structuring numerous basic transistor active cells on the same starting material wafer using different multi cell arrangements in a top view plane, also called layouts. Typical layouts for planar power semiconductors are stripe designs as shown in FIG. 2A, or various closed cell layouts such as square designs shown in FIG. 2B, hexagonal cell designs shown in FIG. 2C, octagonal cell designs shown in FIGS. 2D-F, and rectangular cell designs shown in FIG. 2G. Similar multi cell arrangements can be used for trench type transistor active cells, for example square cell layouts as depicted in FIG. 3A. For clarity, in the above-mentioned top view plane Figures, the top insulation layers and metal electrodes are omitted.

In GB Patent Applications No. 1910012.2 and No. 2019586.3, novel transistor active cell designs are proposed, combining the advantages of using both trench and/or planar gate electrodes, to achieve for example Silicon IGBTs or Silicon Carbide MOSFETs with improved on-state performance, good controllability and low switching losses.

When a suitable control or gate voltage is applied on the trench gate electrodes, a MOS channel is formed along the lateral walls of the trench recesses embedding the first gate electrodes. If additionally, a planar gate is also included in the active cell, and is electrically connected to the trench gate electrodes, an additional planar MOS channel may be formed on an emitter surface. This additional planar MOS channel may be connected in parallel or in series with the lateral trench wall MOS channels, and will provide an unobstructed flow path for electrons from the source regions to the drift layer. Consequently, the device enters the conduction mode and is characterized by an on-state voltage drop smaller than traditional transistor cell designs.

This cell design adopts mesa widths (trench to trench distance) below 1 µm to achieve very low conduction losses, because closely packed trenches can provide a strong barrier to hole drainage, as well as improved reverse bias blocking performance. Matching such a performance is possible with the described novel design having the less complex processes, i.e., the region in between two adjacent trenches must not be further structured to create contact opening, source regions, or other structures.

In reality, a fully functional semiconductor device requires a multitude of transistor active cells having interconnected gate electrodes. This electrical connection is achieved outside of the active cell parts, through additional conductive structures such as gate runners or "gate runners", which converge to a central gate pad region, in order to simplify the semiconductor die's connection with wire bonds and power modules. The challenge is to identify the optimal means to electrically connect the plurality of trench and/or planar gates within an active cell, as well as between adjacent active cells, using a method that is easily manufacturable, and does not generate performance impairing effects for example an increased gate-collector capacitance.

SUMMARY

A semiconductor device according to the invention comprises a drift layer of a first conductivity type with a first and a second surface. For lateral type semiconductors, the first and second surface may be substantially on the same side of the drift layer. For vertical type power semiconductors, the first and second surface may be opposite to each other, i.e., spaced apart along a first dimension. Insulated first gate electrodes are formed on the first surface embedded in trench recesses and distributed according to various striped or cellular patterns. The semiconductor device further comprising one or more active semiconductor cells, each of said active semiconductor cell which comprises
  a part of the drift layer and
  source regions of the first conductivity type having a doping density higher than said drift layer, and formed by ion implantation through a source lithography mask, said source regions having a singular point defined as the position on the first surface of the outermost edge of said source mask,
  a first base layer of the second conductivity type having a position of highest surface dopant concentration,
  a second base layer of the second conductivity type embedded in the first base layer, having a doping concentration higher than said first base layer, and
  emitter electrodes which are formed on the first surface and contact the source regions, and the second base layer through a contact opening.

The first and second base layers, and the source regions are formed within the first layer adjacent to the first surface, and extend laterally in a second dimension. The first and the second base layers, and the source regions may extend in a top view plane in a third dimension, perpendicular to the second dimension.

At least one of the following features or any combination thereof applies:
  the first gate electrodes are embedded in trench recesses arranged in various striped layout configurations, when observing in the top view plane, or
  the first gate electrodes are embedded in trench recesses arranged in a radial/circular/hexagonal layout, etc.—more generally defined as closed cellular designs, when observing in the top view plane, or the first end of the second base layer is substantially aligned with the singular point of the source region in the top view plane.

In an exemplary embodiment, the semiconductor device further comprises additional gate runners comprising at a minimum a gate interconnecting electrode and an insulating layer, said additional gate runners abutting the first gate electrodes, and said additional gate interconnecting electrodes being electrically connected to the first gate electrodes at the corresponding cross points thereof. The additional insulating layer separates the gate interconnecting electrodes from adjacent semiconductor layers. The material of the gate interconnecting electrodes can be substantially identical to the material of the first gate electrodes.

Furthermore, at least one of the following features applies:
- the gate runners are formed as trench recesses (can be similar or different from the trench recesses of the first gate electrodes), or
- the gate runners are formed as planar electrodes on the first surface of the drift layer.

In a further exemplary embodiment, the semiconductor device comprises a second gate electrode which is arranged on the first surface, said second gate electrode being electrically connected to the first gate electrodes. When a suitable control voltage is applied on the second gate electrode, an inversion layer is formed in the first base layer regions under the second gate electrode, and a planar MOS channel will connect the source region and the drift layer on the first surface of the drift layer. The first gate electrodes are electrically interconnected through the second gate electrode, and no additional gate runners are required.

The power semiconductor may further comprise trench recesses of the first gate electrodes shaped with respective stripes. The first base layer, the source region and the second base layer may be shaped with respective stripes in any direction with respect to the stripes of the trenches, and the stripe of the first base layers, source region and second base layer may be divided into rectangles spaced apart from each other by the stripes of the trenches.

Alternatively, the first base, source region and second base layer may be shaped with respective stripes, the trench recesses of the first gate electrodes may be shaped with respective stripes in any direction with the stripes of the first base layer, source region and second base layer, and the stripe of the trenches may be divided into rectangles spaced apart from each other by the stripes of the first base layer, source region and second base layer.

The power semiconductor may further comprise a second insulating layer that electrically protects the first base layer, the source region and the drift layer on the first surface.

Some of the first gate electrodes may be electrically connected to the emitter electrode and/or all or some of the first gate electrodes may be electrically floating.

Alternatively, the first and second gate electrodes may not be electrically connected with each other, i.e., the second gate electrode may be made floating or can be grounded, while the first gate electrode remains controlled by a gate potential. In this embodiment, additional gate runners are required to be formed to electrically connect the first gate electrodes.

In further embodiments, one or more of the second gate electrodes may be electrically connected to the emitter electrode and/or one or more of the second gate electrodes may be electrically floating.

We also describe a power semiconductor device comprising a buffer layer of the first conductivity type with a higher doping concentration than the drift layer, which buffer layer is arranged on the second surface of the drift layer, between the drift layer and a collector electrode; and a collector layer of the second conductivity type, which is arranged on the second surface between the buffer layer and the collector electrode.

For stripe designs, a distance between the lateral walls of two adjacent trench gates in the third dimension may be in a range from about 5 µm to below 0.1 µm, more preferably from 1 µm to 0.1 µm and a distance between adjacent trenches in the second dimension extends approximately in a range from about 20 µm to about 1 µm, preferably from 5 µm to 1 µm, and more preferably from 2 µm to 1 µm.

The new transistor cell design offers a wide range of advantages both in terms of performance (reduced losses, improved controllability and reliability), and processability (very narrow mesa design rules, reliable process compatibility) with the potential of applying enhanced layer or reverse conducting structures. Due to the fact that the area in between the trench recesses of the first gate electrodes does not need to be further structured, very high-density trench recesses can be used, with trench mesa dimensions reaching below 100 nm. This will significantly reduce the hole drainage effect in bipolar semiconductors, a well-known issue to experts in the field.

Unlike traditional transistor cells, if a second gate electrode is not present, the MOS channel width is determined by a segment of a circle arranged uniquely on the lateral trench walls of the first gate electrodes, and centred at the singular points of the source regions.

The power semiconductor device may comprise a third layer of the first conductivity type having a doping density higher than the drift layer, and lower than the doping density of the source regions. This layer is an enhancement layer, and may separate at least partially the first base layer and the drift layer.

The design is especially suitable for reverse conducting structures with a collector shorted layer (i.e., comprising alternate regions of the first and second conductivity types) arranged at the second surface between a collector electrode and the buffer layer. This is because the elimination of the vertical trench channel in the transistor unit cell, and the presence of the highly doped second base layer in the trench regions for improved diode on-state losses.

The new design can be applied to both vertical and lateral IGBTs and MOSFETs based on silicon or wide bandgap materials such as Silicon Carbide SiC, Gallium Nitride, Zinc Oxide, etc.

The method for manufacturing a power semiconductor device, in particular an IGBT or MOSFET, has the advantage that one single mask is needed for structuring the emitter side with the base layers and the source region, by ion implantation and thermal diffusion. These layers are self-aligned by using the structured second gate electrode layer as a mask. However, an additional mask must be used to structure the first surface of the power semiconductor if a planar second gate electrode is omitted.

Further advantages according to the present invention will be apparent from the dependent claims.

BRIEF DESCRIPTION OF THE DRAWINGS

The invention will be explained in more detail in the following text with reference to the attached drawings, in which.

The reference symbols used in the figures and their meaning are summarized in the list of reference symbols. The drawings are only schematically and not to scale. Generally, alike or alike-functioning parts are given the same reference symbols. The described embodiments are meant as examples and shall not confine the invention.

DETAILED DESCRIPTION

Figure 1A:
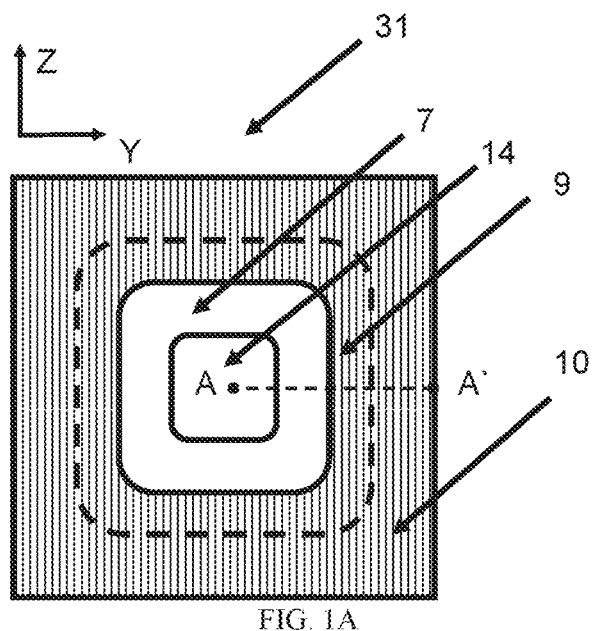
FIG. 1A: shows a top view of a Planar MOS IGBT with square cell structure.
Figure 1B:
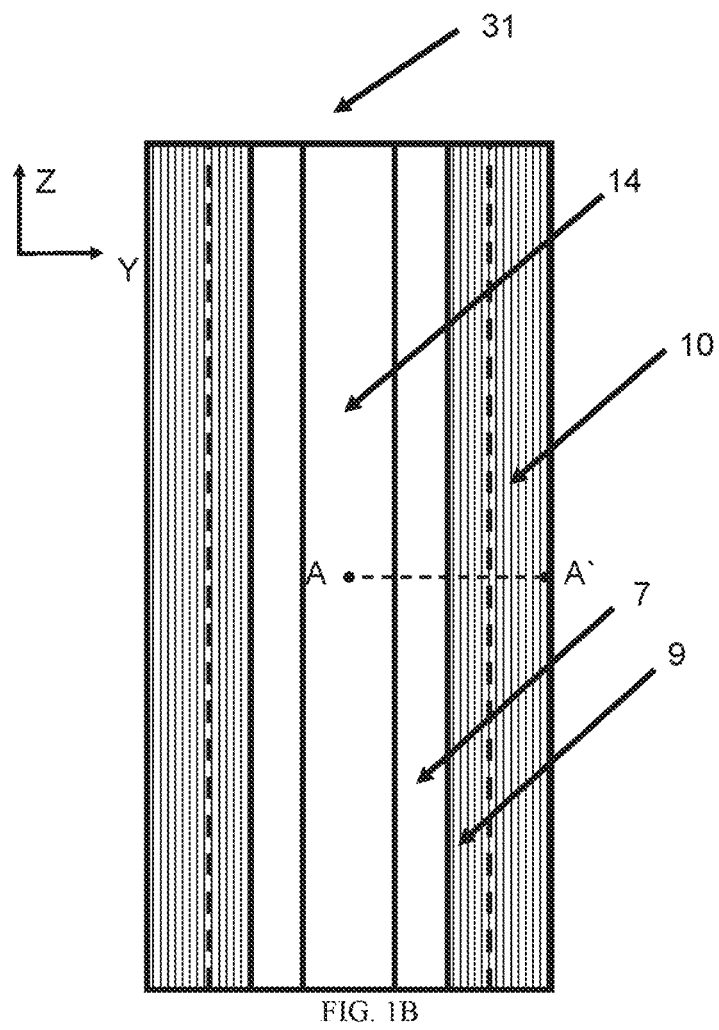
FIG. 1B: shows a top view of a Planar MOS IGBT with stripe cell structure.
Figure 1C:
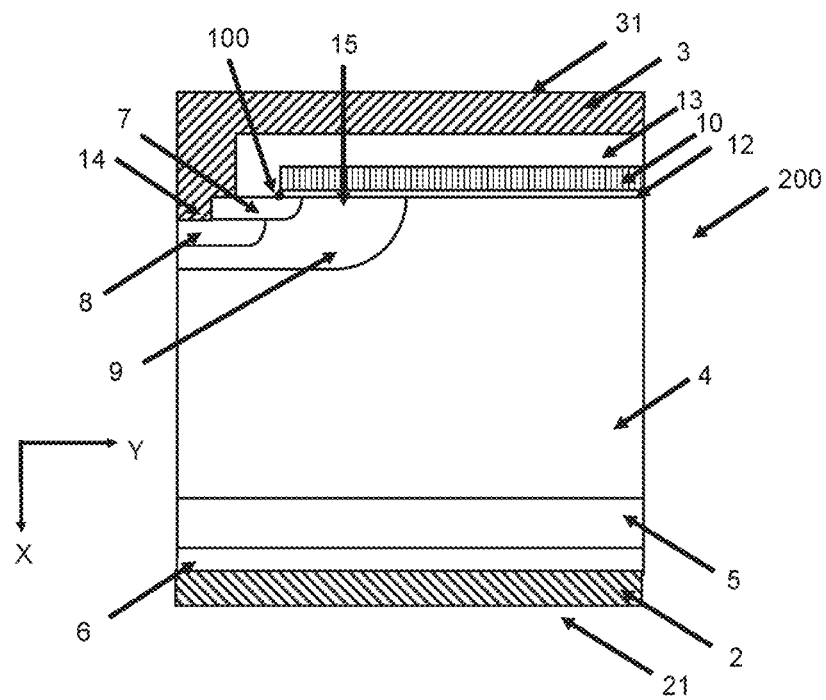
FIGS. 1C-D: show cross sections of a Planar MOS IGBT across cut lines A-A' in FIG. 1A-B, without, and with an enhancement layer.
Figure 1D:
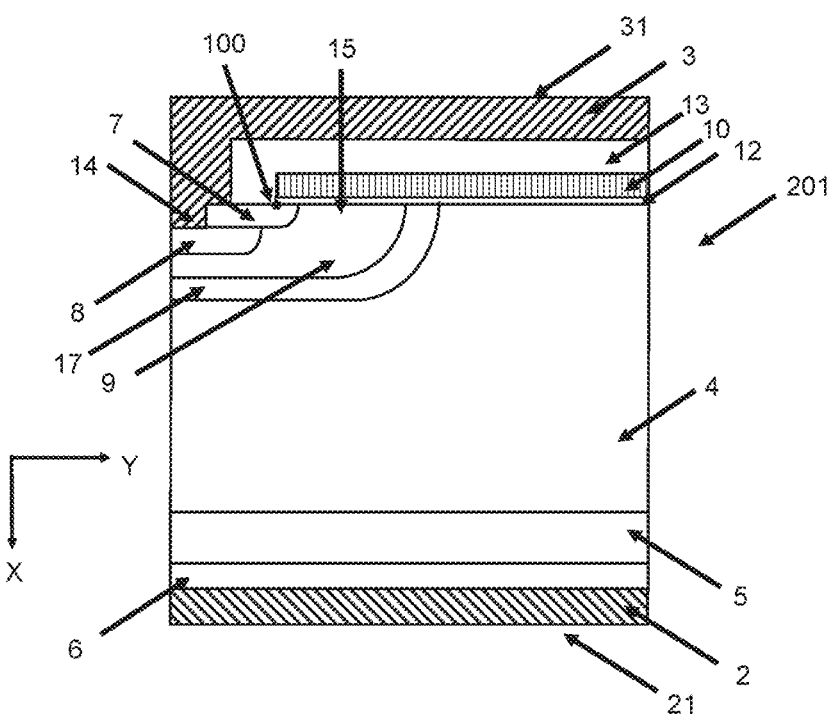
Figure 2A:
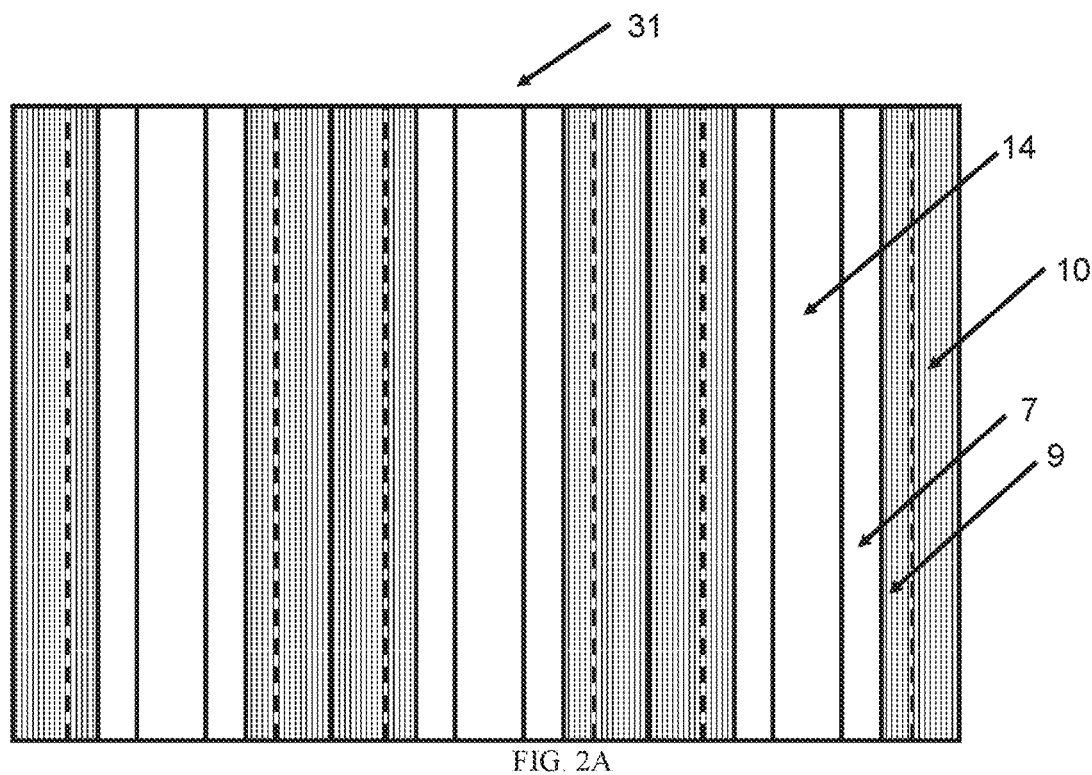
FIGS. 2A-G: show top views of multi cell arrangements of Planar MOS IGBTs.
Figure 2B:
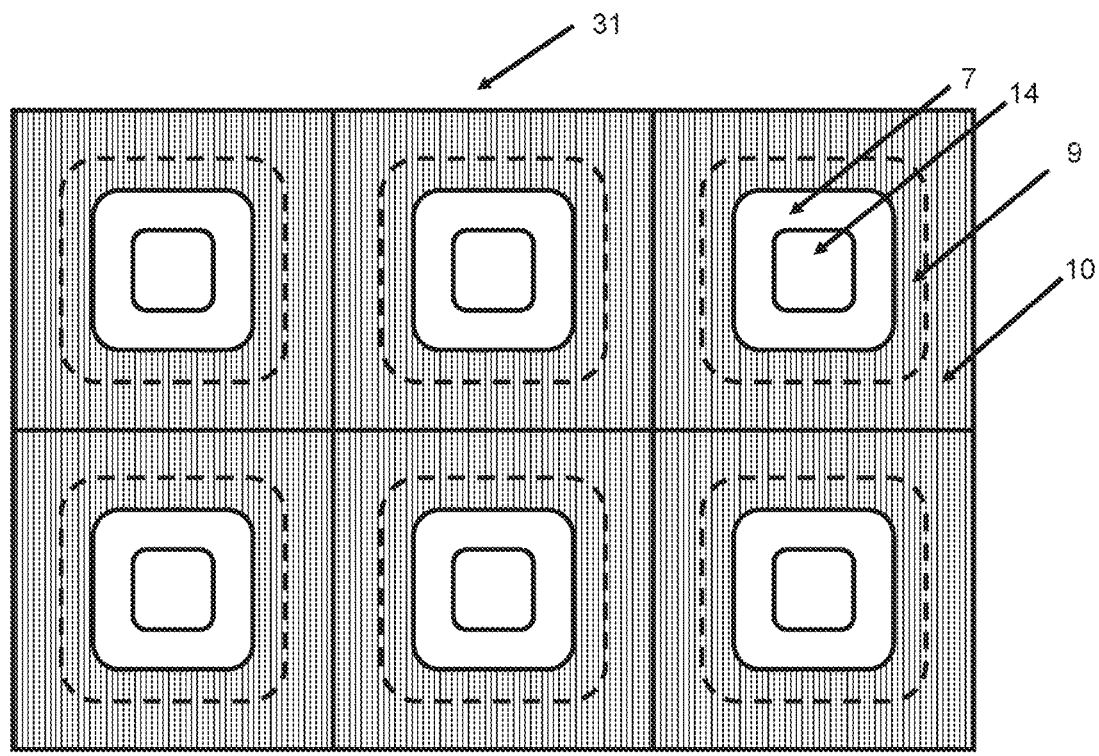
Figure 2C:
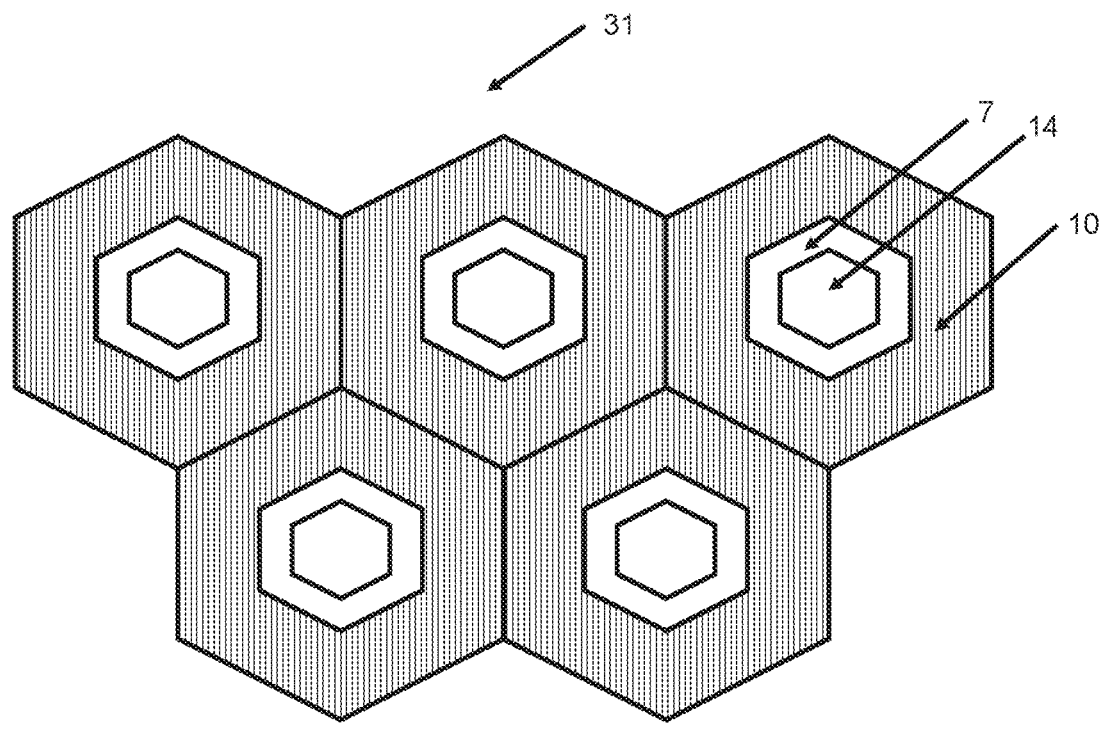
Figure 2D:
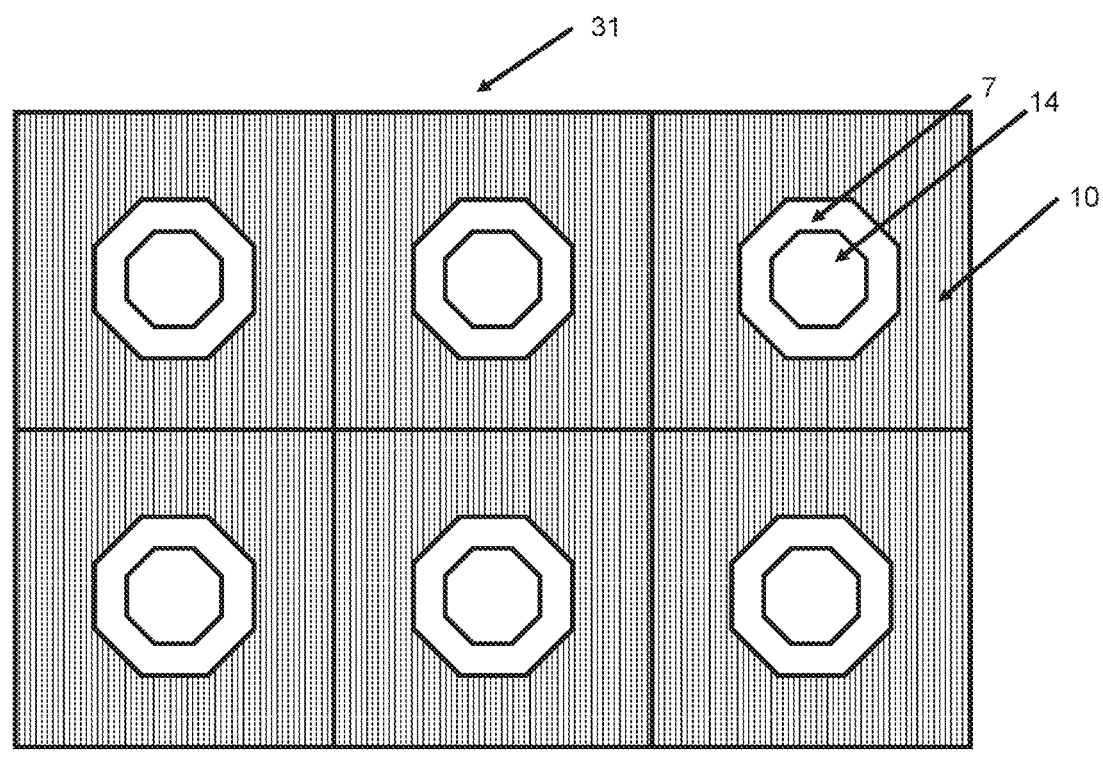
Figure 2E:
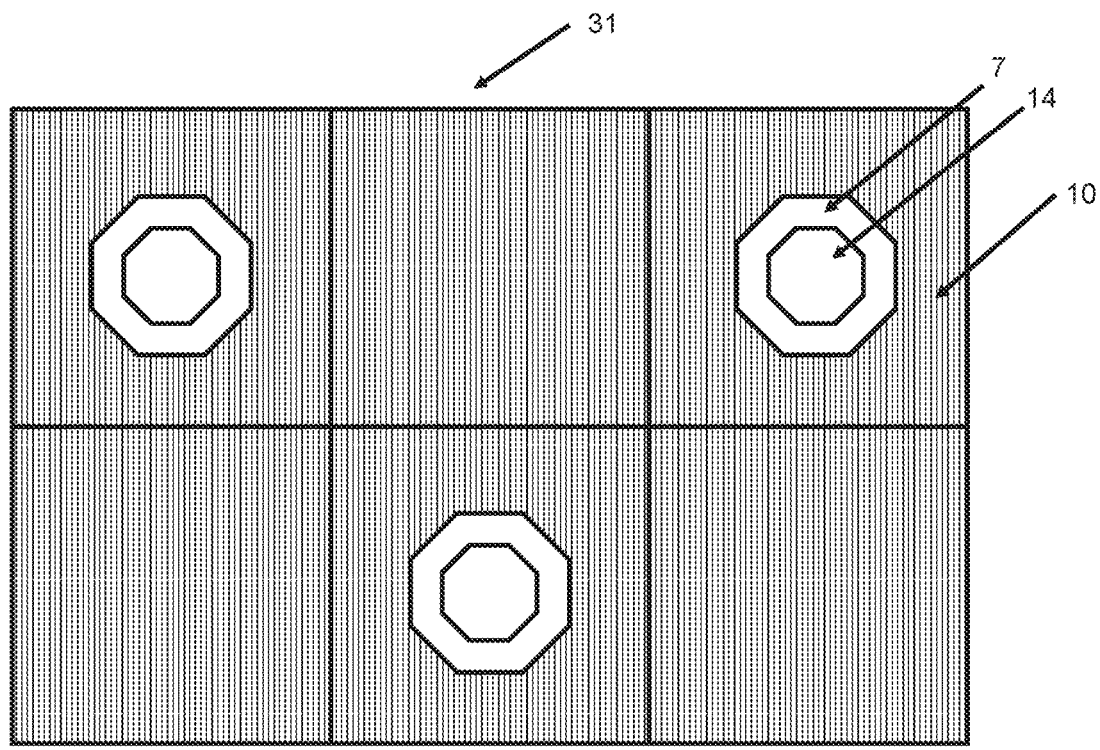
Figure 2F:
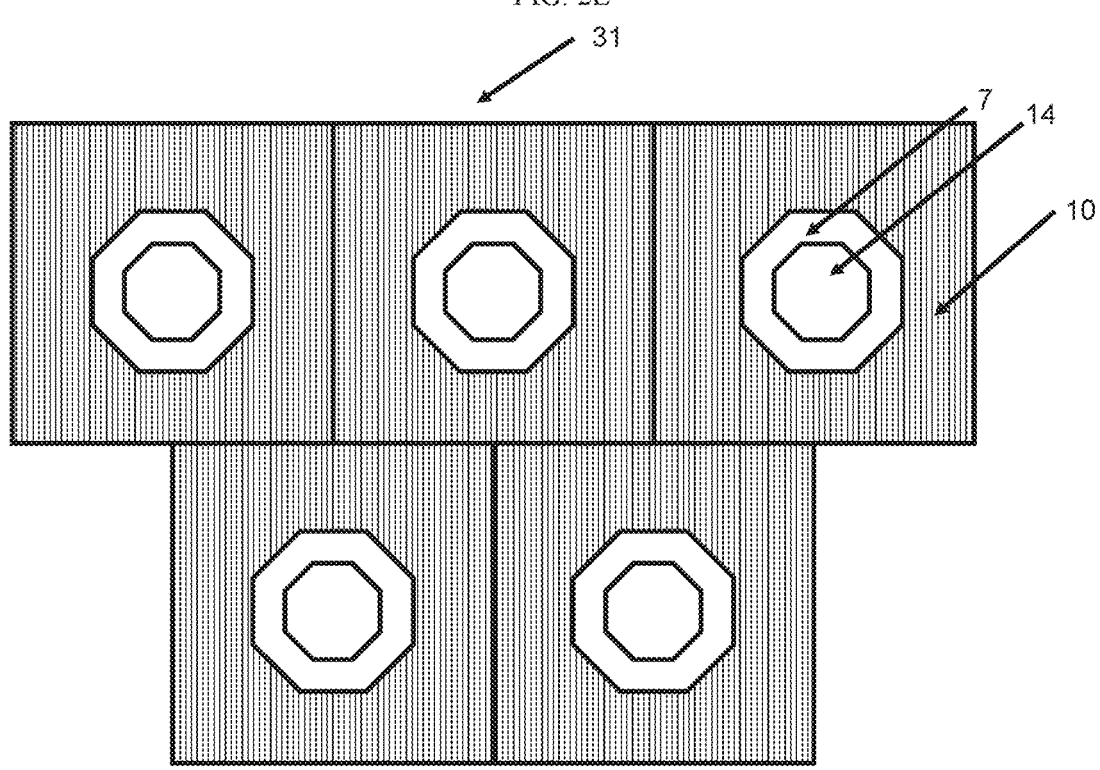
Figure 2G:
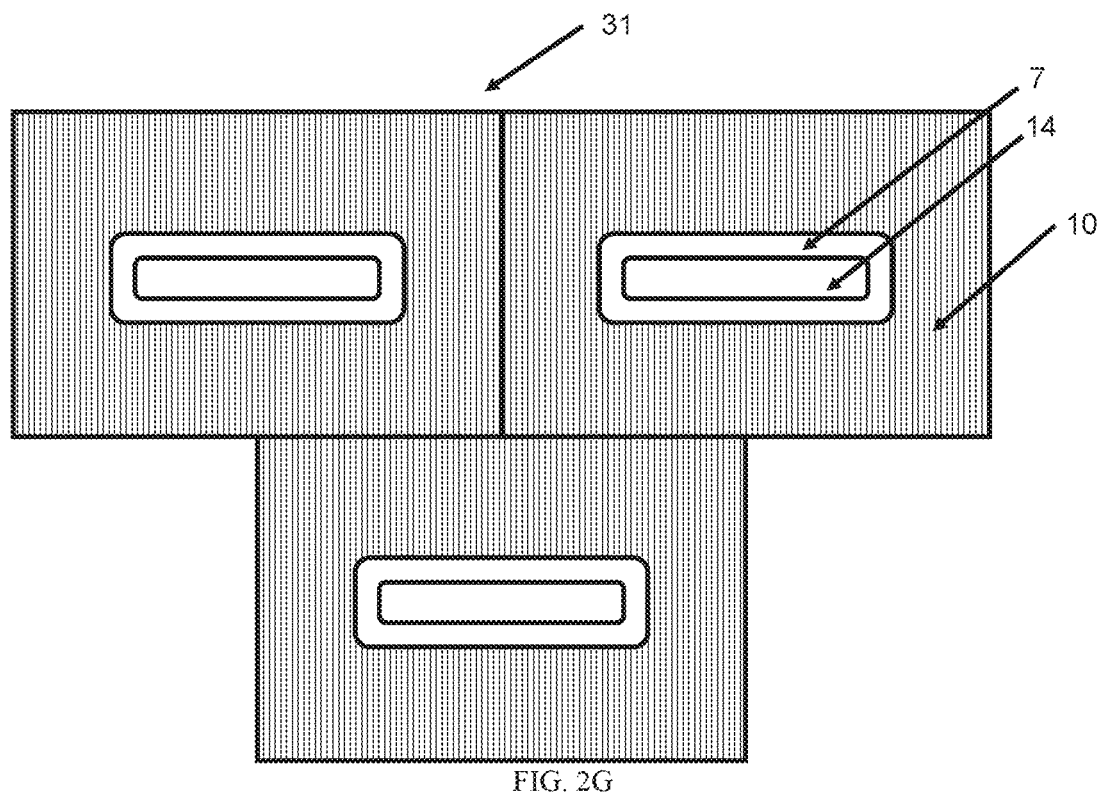
Figure 3A:
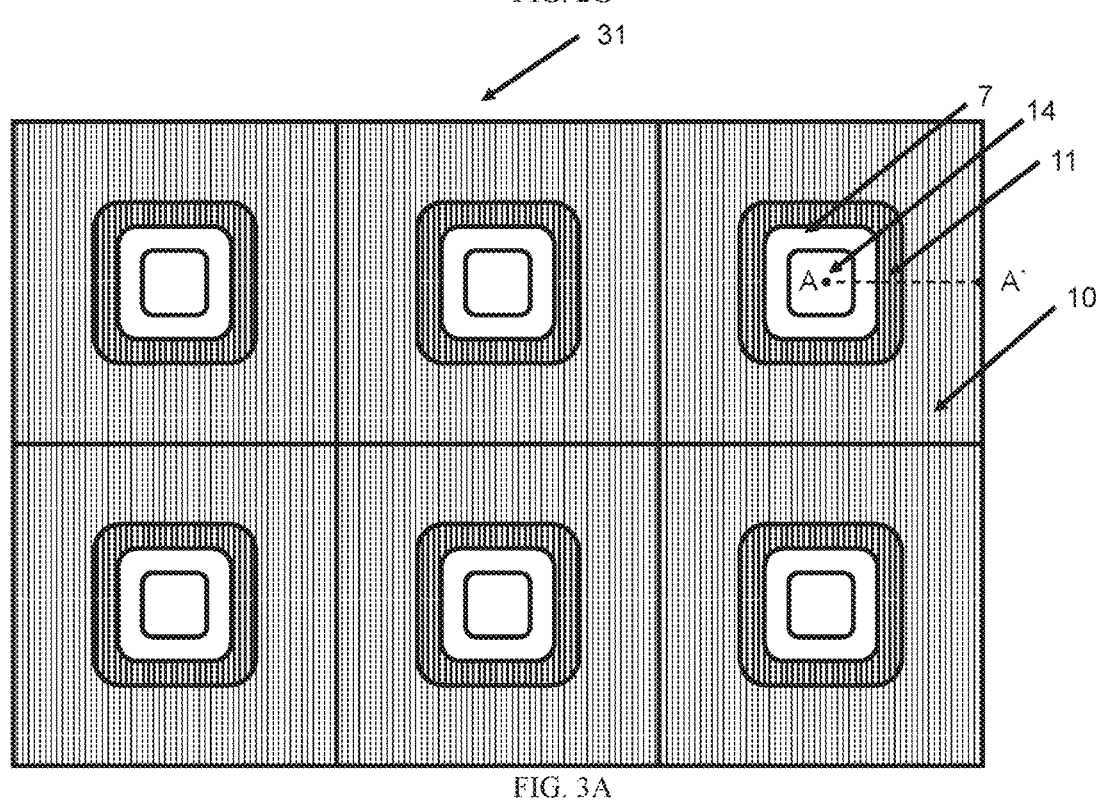
FIG. 3A: shows a top view of a multi cell arrangement of Trench MOS IGBT with square cell structure.
Figure 3B:
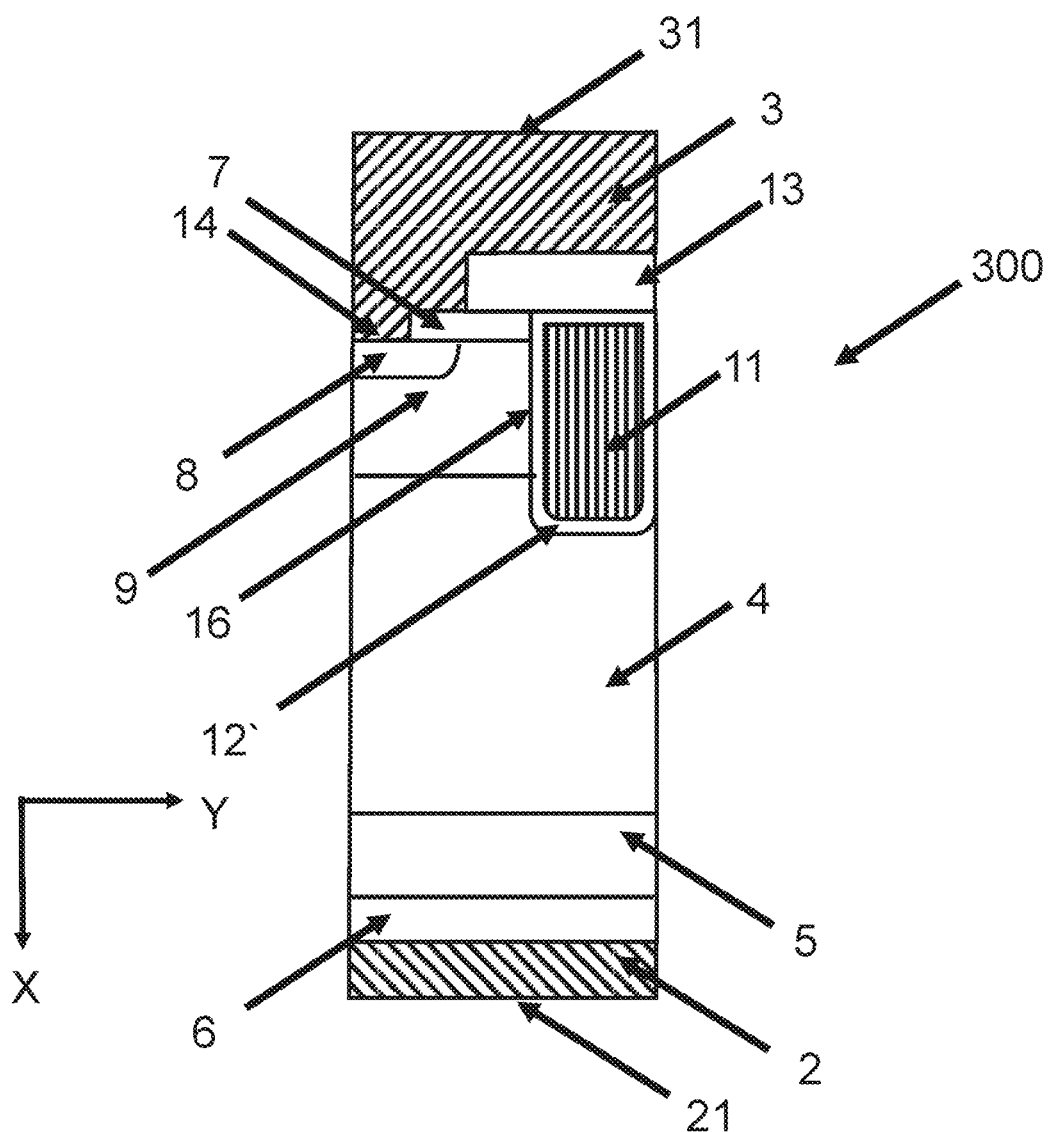
FIGS. 3B-C show cross sections of Trench MOS IGBT along the cut line A-A' in FIG. 3A.
Figure 3C:
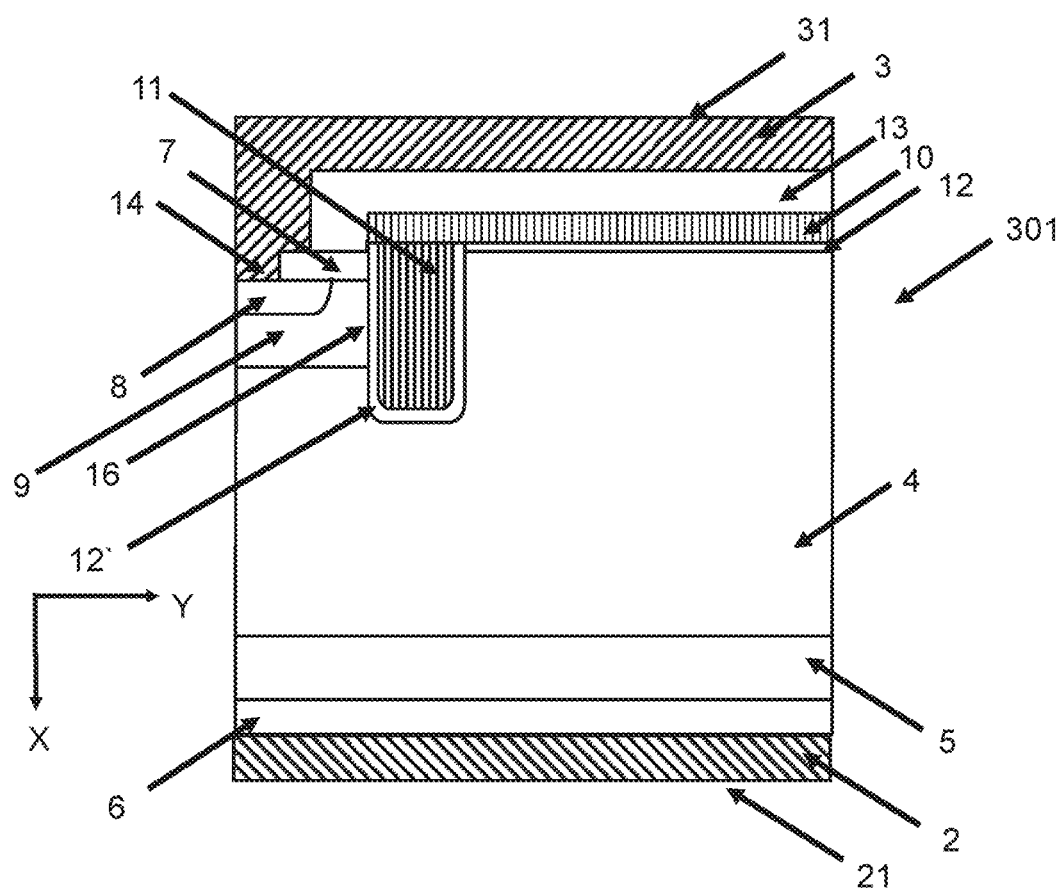
Figure 4:
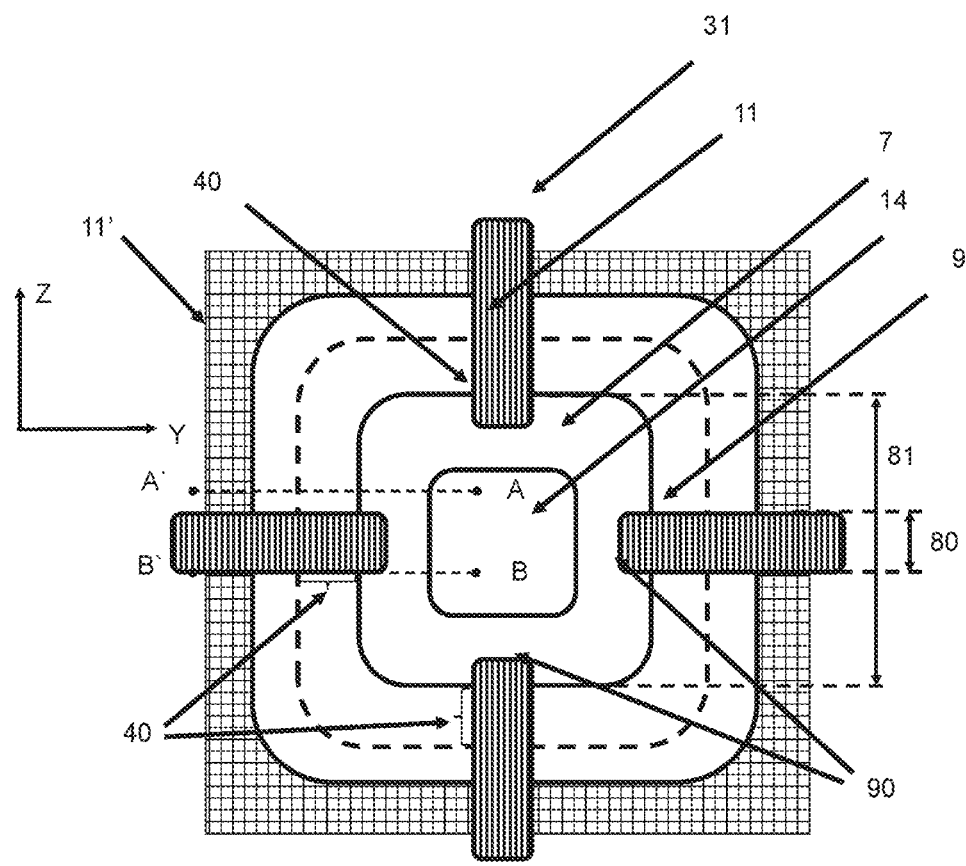
FIG. 4: shows a top view of the first example embodiment of a transistor active cell according to the invention.
Figure 5A:
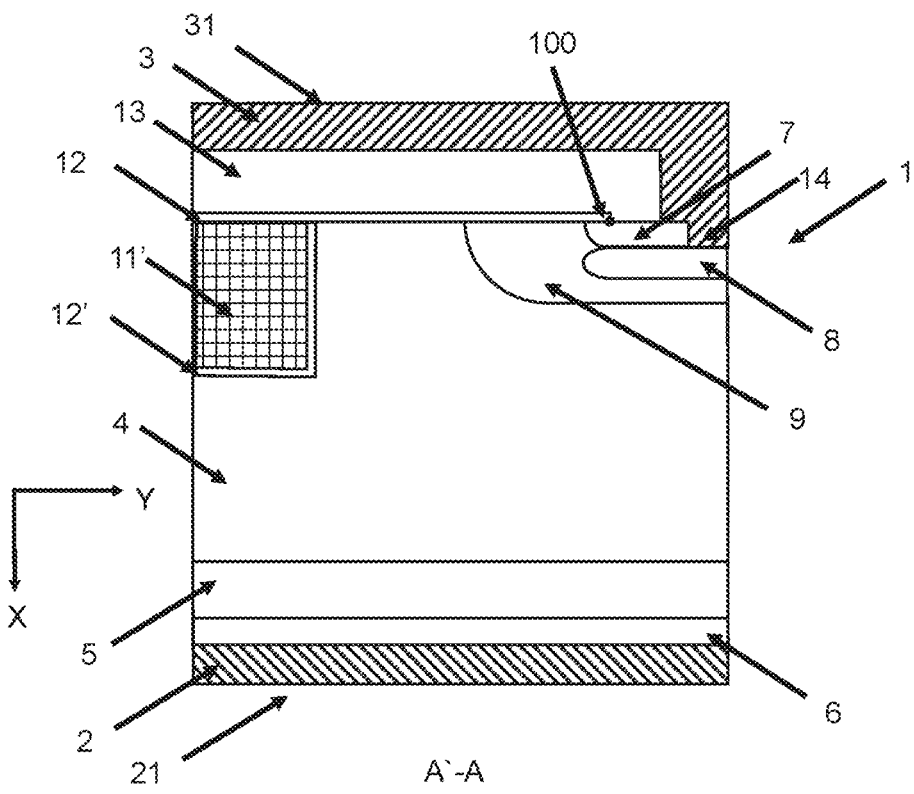
FIGS. 5A-B: show the cross sections of the first example embodiment of a transistor cell according to different cut lines in FIG. 4. The interconnecting gate region is formed as trench recesses.
Figure 5B:
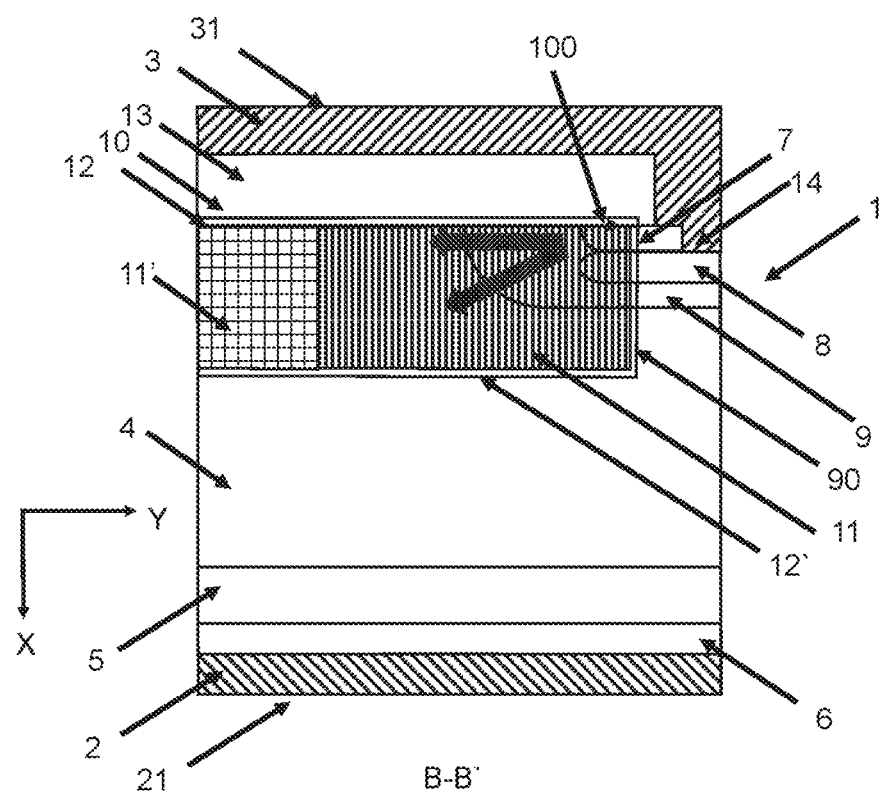

FIG. 4 shows a top view of the first exemplary embodiment of a semiconductor transistor cell 1. FIGS. 5A-B show more specific details in cross sections at different cut lines as depicted in FIG. 4, in form of a punch through insulated gate bipolar transistor (IGBT) with a four-layer structure (pnpn). The layers are arranged between an emitter electrode 3 on an emitter side 31 and a collector electrode 2 on a collector side 21, which is arranged opposite of the emitter side 31 in a first direction X. The IGBT transistor cell comprises an (n−) doped drift layer 4, which is arranged between the emitter side 31 and the collector side 21, and a p doped first base layer 9 arranged on the emitter side 31 of the drift layer 4, and extending into the drift layer 4 in the X direction. The transistor cell 1 also comprises an n doped source region 7, which is arranged at the emitter side 31 embedded into the first base layer 9, and directly contacting the emitter electrode 3. The source region 7 has a higher doping concentration than the drift layer 4. Both the source region 7 and the first base layer 9 are shaped as a square in a top view plane defined by the Y-Z directions.

Figure 17A:
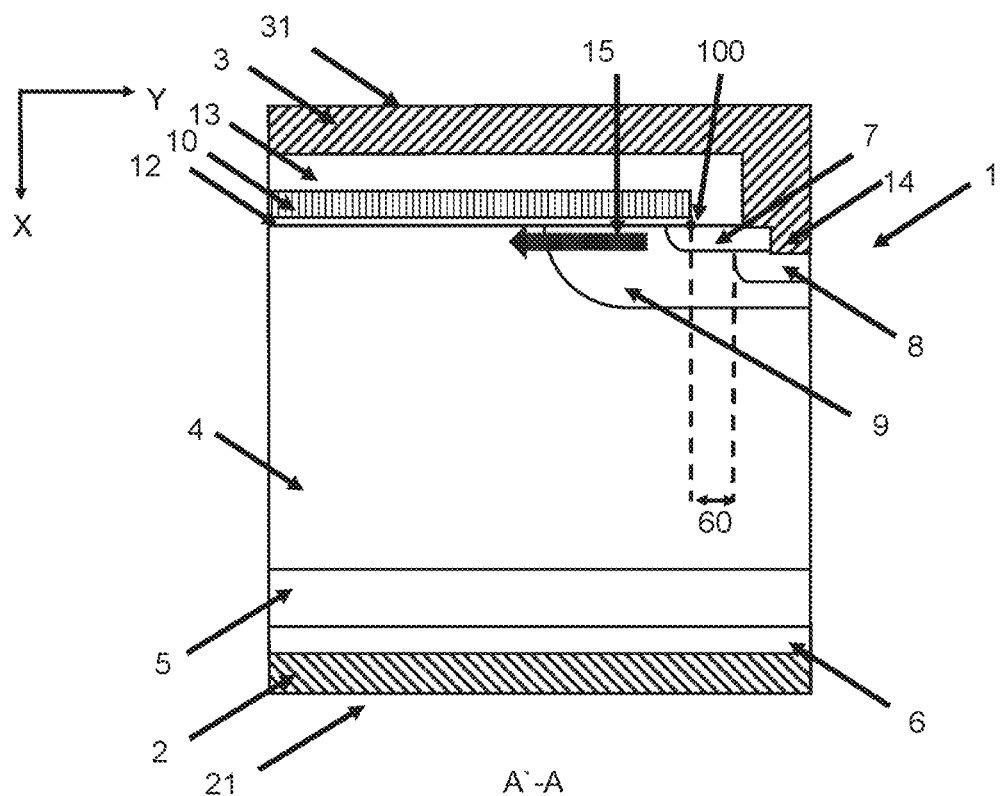
FIGS. 17A-B: show cross sections of an eleventh exemplary embodiment, where the first end of the second base layer is at a substantially different position than the position of the singular point 100 in the Y direction.

The innovative power semiconductor transistor cell 1 further comprises a p doped second base layer 8, which is arranged between the first base layer 9 and the emitter electrode 3, which second base layer 8 is in direct electrical contact to the emitter electrode 3. The second base layer 8 has a higher doping concentration than the first base layer 9. The second base layer 8 extends in the X direction deeper than the source region, and is shaped as a square in the same top plane view. In the direction Y, the first edge of the second base layer is spaced apart by a separation region 60 from the singular point 100 of the source region 7. The separation region 60 has a length that can be substantially 0 as represented in FIG. 5A, can be larger than 0 as represented in FIG. 17A, or can be negative (not shown).

Furthermore, a plurality of first gate electrodes 11 are embedded in corresponding trench recesses, each electrode 11 being electrically insulated from the first base layer 9, the second base layer 8, the source region 7 and the drift layer 4 by a first insulating layer 12'. The first gate electrodes 11 extend both in the Y and Z directions, and are arranged at an angle of 90 degrees with respect to the sides of the square cell, when observed in the top view plane. The trench recesses intersect both the source region 7 and the second base layer 8, i.e. the first end trench wall 90 of the first gate electrodes is arranged in the source region 7.

A second insulation layer 12 is arranged on the emitter side 31, protecting the surface of the drift layer 4, of the first base layer 9 and of the source region 7. The layer 12 can also be used as a masking layer for the implantation of ions forming the source region 7 and the first base layer 9.

The first base layer 9 and the source region 7 are usually formed by subsequent steps of implanting ion dopants through a mask such as the polysilicon gate cell opening. Each ion implant step is followed by thermal annealing and activation of the dopants. Because the two layers 7 and 9 have opposite dopant types, the out-diffusion of dopants will locally compensate in all three directions X, Y, Z leading to the formation of a main p-n junction.

For silicon-based drift layers, this is depicted schematically in FIG. 5A, where it can be seen that the source region 7 will feature a singular point 100 closest to the edge of the second insulating layer 12, which is used as masking layer for implanting ions of the source region 7 and first base layer 9. At the singular point 100, the surface doping concentration of the source region 7 reaches a maximum value, after which is starts to decrease towards the p-n junction it forms with the first base layer 9. The singular point 100 is a key feature of the power semiconductor device, as it defines the source region 7 and first base layer 9, and subsequently other key MOS parameters such as the channel width, channel length, threshold voltage, and the maximum doping concentration for supplying the electron charge carriers from the source region 7.

Additionally, gate runners 11' are formed outwards of the first base layer 9, with the purpose of interconnecting the first gate electrodes 11. The gate runners 11' can be formed with trench recesses, similar or different than the trench recesses of the first gate electrodes 11. The gate runners 11' can also be formed with planar electrodes, as will be described at a later point.

The power semiconductor device according to the first exemplary embodiment further comprises a p-doped collector layer 6 arranged between a buffer layer 5 and the collector electrode 2, which collector layer 6 is in direct electrical contact to the collector electrode 2. An n-doped buffer layer 5 is arranged between the collector layer 6, and the drift region 4. A third insulation layer 13 is arranged between the emitter electrode 3, the first gate electrodes 11, and the gate runners 11'.

The emitter electrode 3 and the insulating layer 13 are omitted in most of the Figures showing top plane views, in order to better facilitate the visualisation of the underlaying structures.

In the first exemplary embodiment depicted in FIG. 4, and cross sections FIG. 5A-B, a voltage applied on the first gate electrodes 11 initiates the formation of an inversion layer in the first base layer 9. If a positive voltage is applied, with a value above a threshold value, the inversion channel is formed only on the active lateral trench walls 40, except in the regions abutting the highly doped second base layer 8, which has higher dopant concentration than the first base layer 9. No surface inversion layer is formed on the emitter side 31 of the first base layer 9. This aspect represents a paradigm shift in the design and functionality of power semiconductors, as it changes the rules known to, and used by, the experts in the field, in relation to MOS channel sizing and its operation.

Figure 6A:
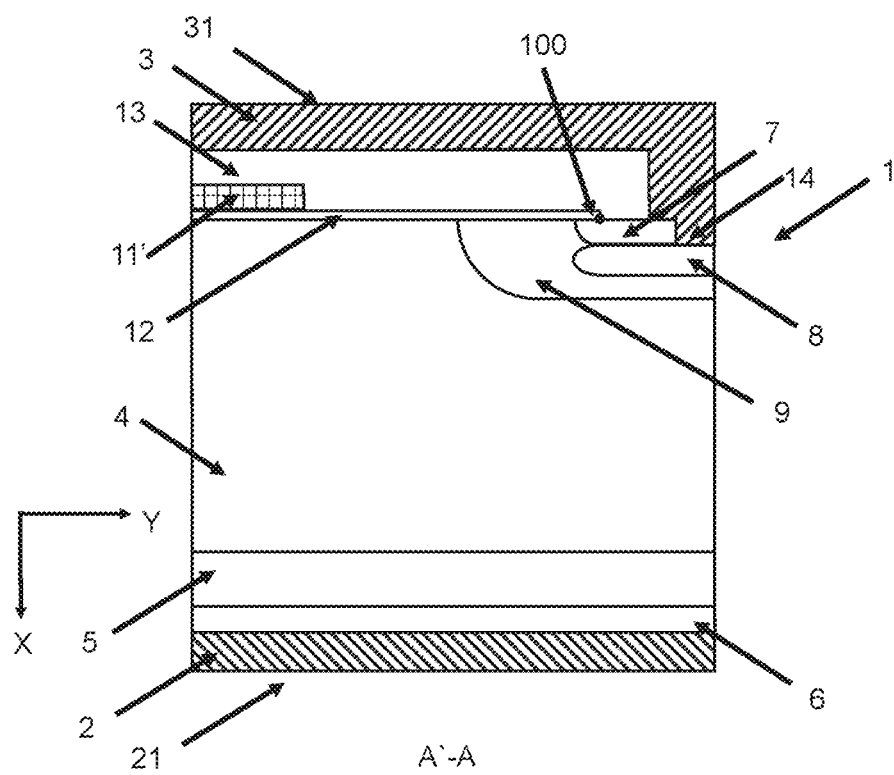
FIGS. 6A-B: show the cross sections of the first exemplary embodiment of a transistor cell according to different cut lines in FIG. 4. The interconnecting gate region is formed as planar electrode.
Figure 6B:
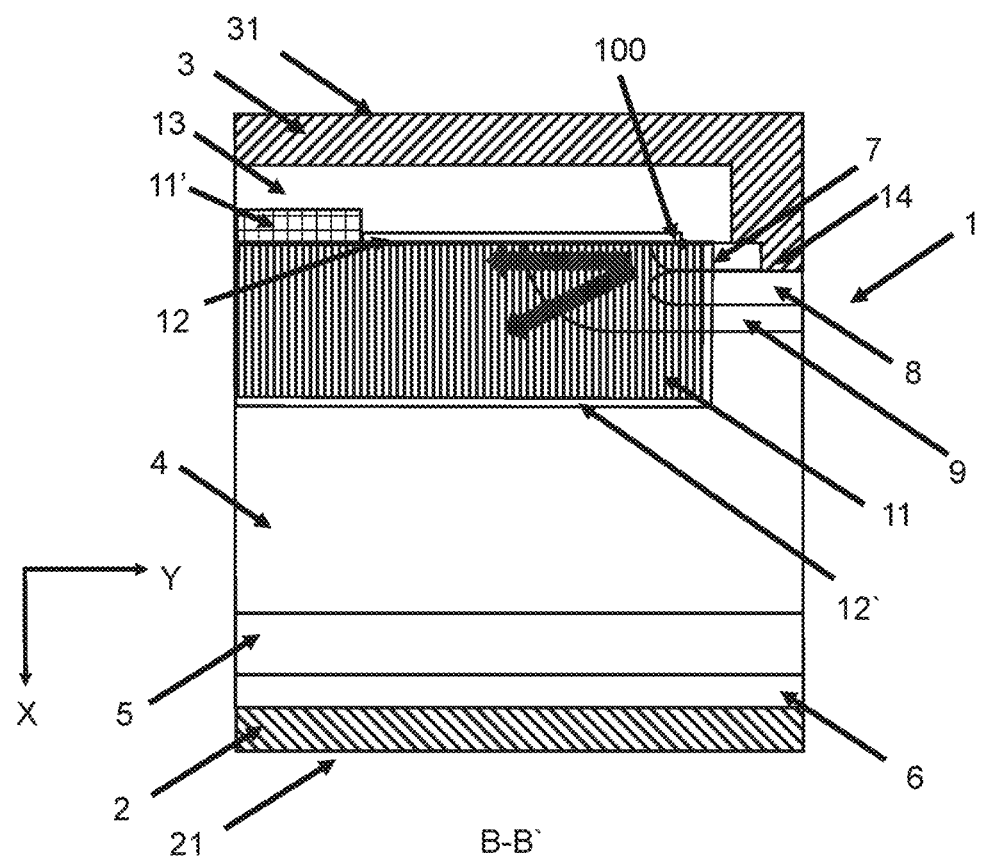

In the first embodiment, at least one of the following features or any combination of features is included:
- the gate runners 11' are embedded in trench recesses formed on the emitter side 31 simultaneously with the first gates 11, therefore having similar geometry of the trench recesses, and similar electrode and insulating layers as shown in FIG. 5A-B; or,
- the gate runners 11' are embedded in trench recesses formed with different processes than the first gates 11, therefore having different geometry of the trench recesses, and different electrode and insulating layers (not shown); or,
- the gate runners 11' are formed as planar electrodes on the emitter side 31 of the drift layer 4, and separated from the drift layer 4 by the second insulating layer 12, as shown in FIG. 6A-B.

Figure 7:
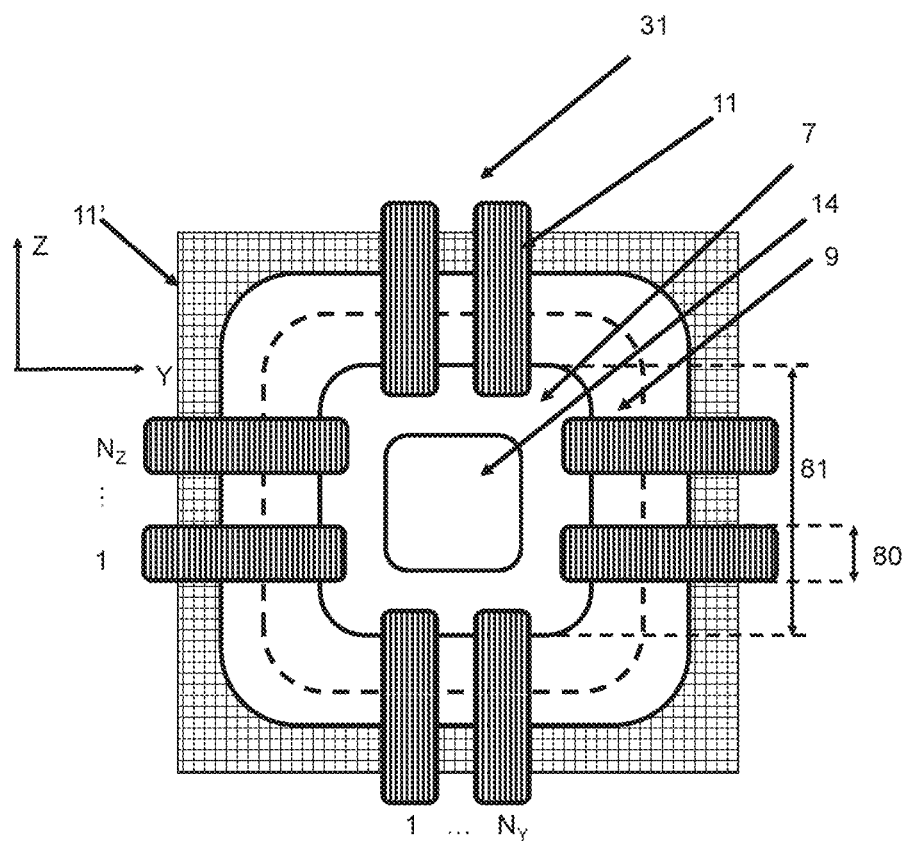
FIG. 7: shows a top view of a second exemplary embodiment with multiple first gate electrodes on each side of the cell.

In a second exemplary embodiment shown in FIG. 7, the dimension 81 of the square shape of the source region 7 is much larger than the width 80 of the trench recesses of the first gate electrodes 11. Consequently, a plurality of first gate electrodes 11 can be formed on each side of the square cell, and furthermore, a different number of first gate electrodes can be formed in the Y and Z directions if needed. Such an arrangement permits minimizing the separation between trench regions to sub-micron dimensions, which in turn, is expected to increase the electron-hole plasma concentration in the active transistor cell.

Figure 8:
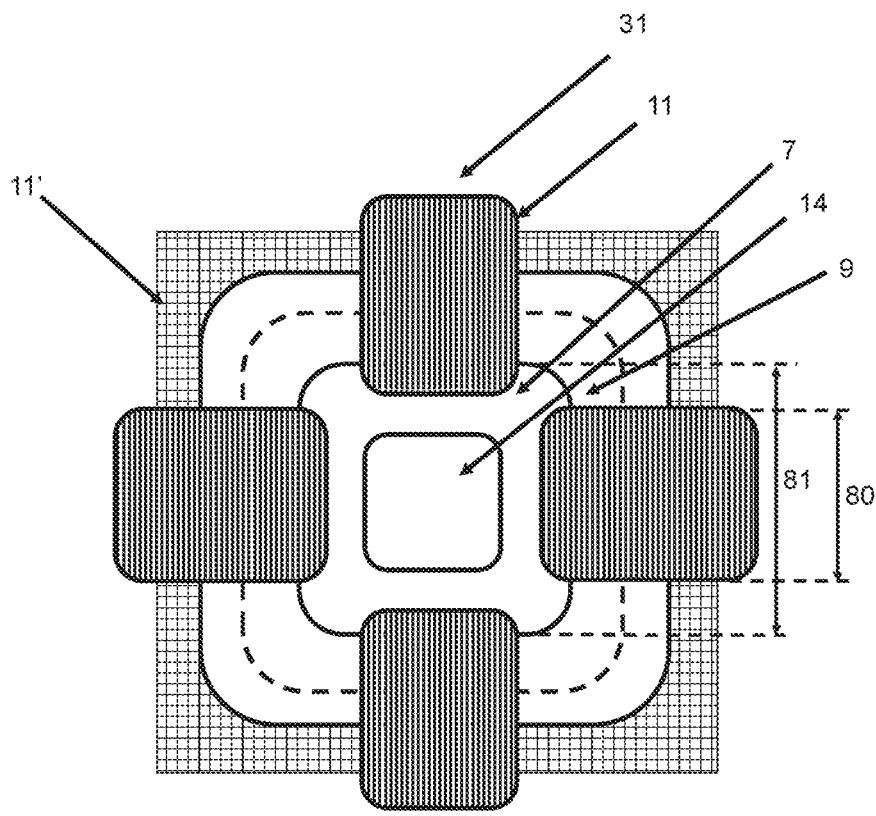
FIG. 8: shows a top view of a third exemplary embodiment where the width of the transistor cell is substantially similar to the width of trench recesses of the first gate electrodes.

In a third exemplary embodiment shown in FIG. 8, the dimension 81 of the square form shaping the source region 7 is further miniaturized, limited only by the capabilities of the current lithography systems. At a certain point, the dimension 81 of the source region 7 becomes comparable with the width 80 of the trench recesses, so that only one first gate electrode 11 can be formed on each side of the source region 7. This method of ultimate miniaturization of the transistor cell can open up new design approaches, not only for power semiconductors, but also for ICs.

Figures 9, 10A:
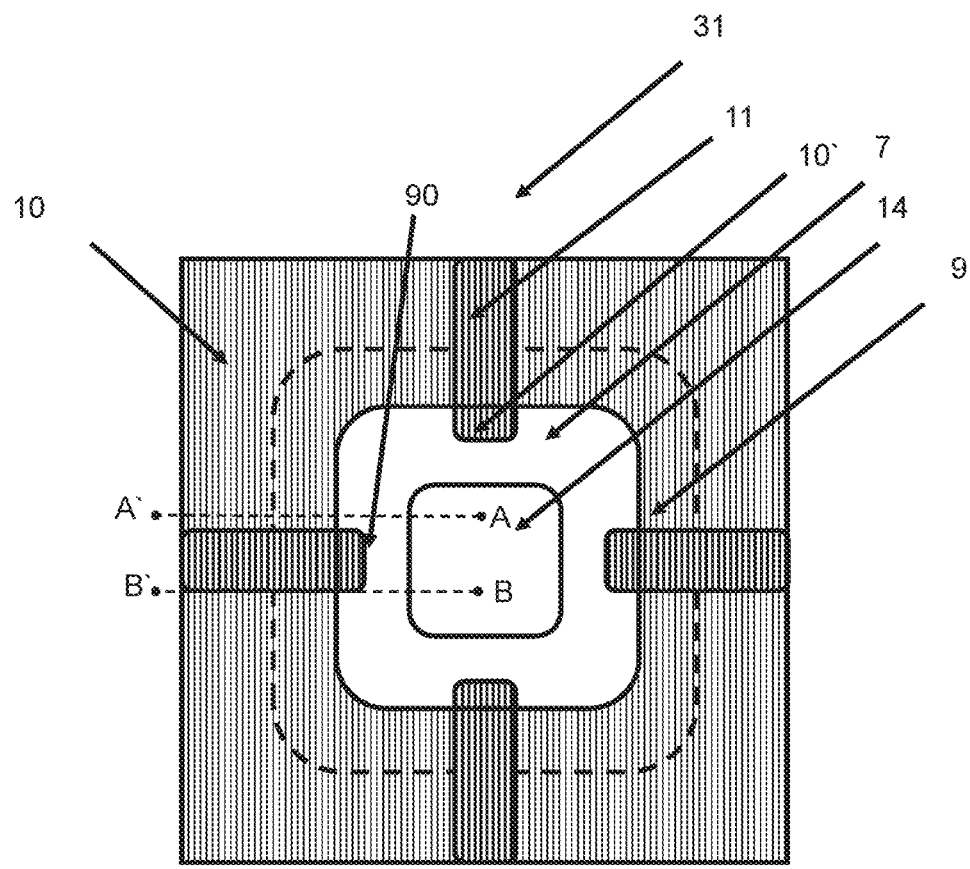
FIG. 9: shows a top view of a fourth exemplary embodiment, with second gate electrodes as gate runners.
FIGS. 10A-B: show the cross sections of the fourth exemplary embodiment along the cutlines in FIG. 9. The thick arrows indicate the flow of electrons in conduction mode.
Figure 10B:
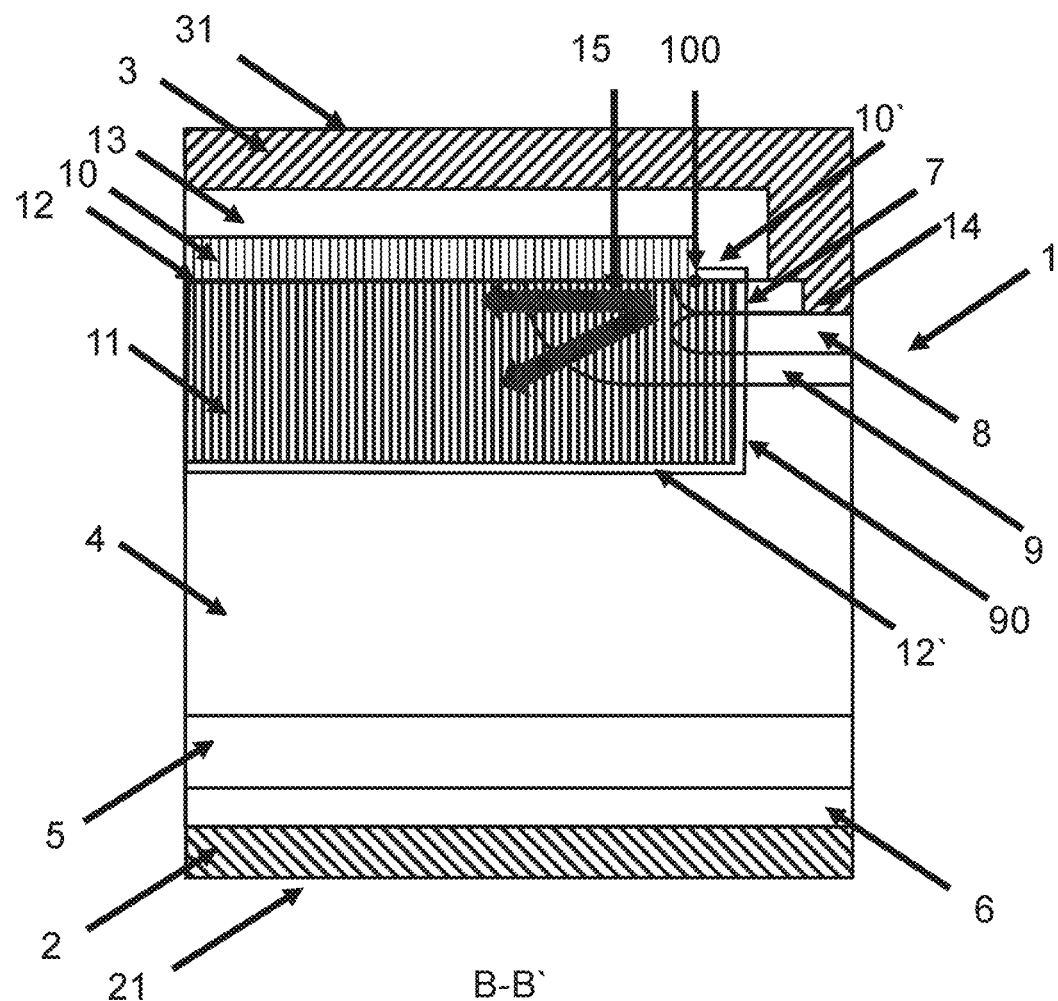

In a fourth exemplary embodiment shown in FIG. 9, a second gate electrode 10 is formed on the emitter side 31 of the drift layer 4, separated from the drift layer 4, the first base layer 9, and the source region 7 by a second insulating layer 12. The second gate electrode 10 can then ensure the electrical connectivity between the first gate electrodes 11, so that no additional gate runners 11' are required. The advantage of this fourth exemplary embodiment resides in the formation of an additional planar MOS channel in the transistor cell, which can be better understood in FIG. 10A-B. However, it may be that in certain designs it is desirable to electrically disconnect some of the first gate electrodes 11 from portions of the second gate electrodes 10, in order to optimize certain static or dynamic functional parameters. In this case, additional gate runners 11' are required, and can be formed as described previously (not shown). Another advantage of the fourth exemplary embodiment resides in simplifying the manufacturing process, in particular reducing the number of masks needed to structure the source region 7 and the first base layer 9. This is because the second gate electrode 10 can be used as a mask for ion implantation.

Figure 11:
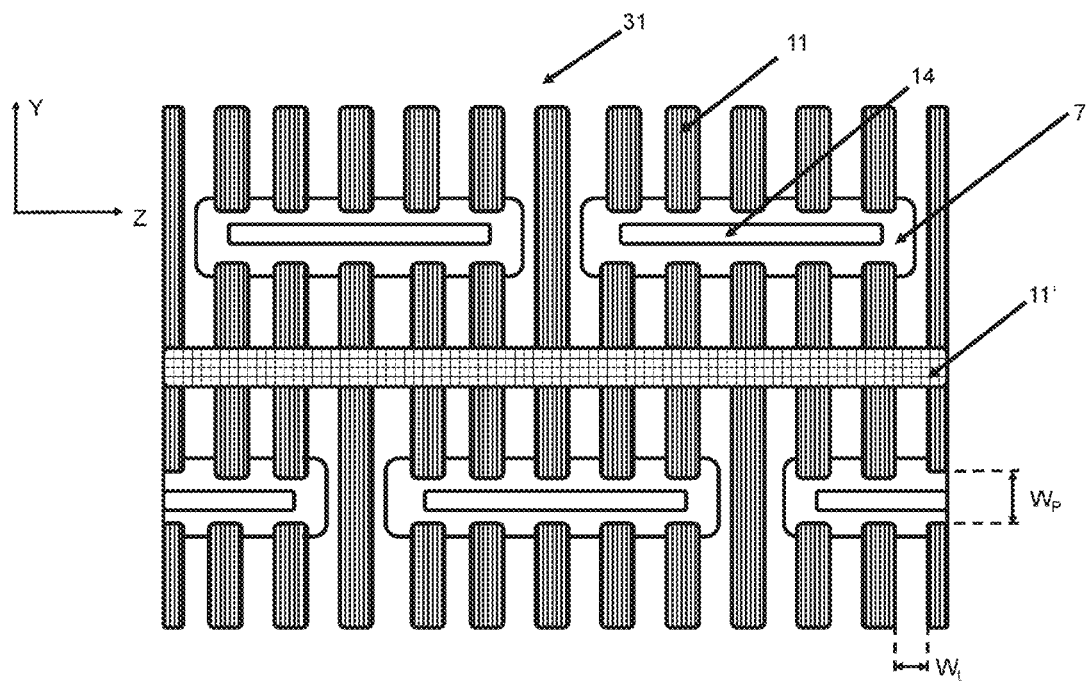
FIG. 11: show the top view of a fifth exemplary embodiment, with a plurality of first gate electrodes, and multi cell arrangements of rectangular transistor cells.

A further fifth exemplary embodiment is shown in FIG. 11 wherein, the source region 7, the first base layer 8, and the second base layer 9 are formed in the shape of elongated rectangles, i.e., one side of the rectangle is substantially larger than the other side of the rectangle. The first gate electrodes 11 are formed with stripes that can be interrupted or continuous over the stripes of the source region 7. The electrode of the additional gate runners 11' can contact the first gate electrodes 11 at the cross points thereof. Not all first gate electrodes 11 must be contacted by the gate runner 11'. As described previously in the first exemplary embodiment, the gate runner 11' can be formed as a trench recess embedding an electrode, or as a planar electrode.

Figure 12A:
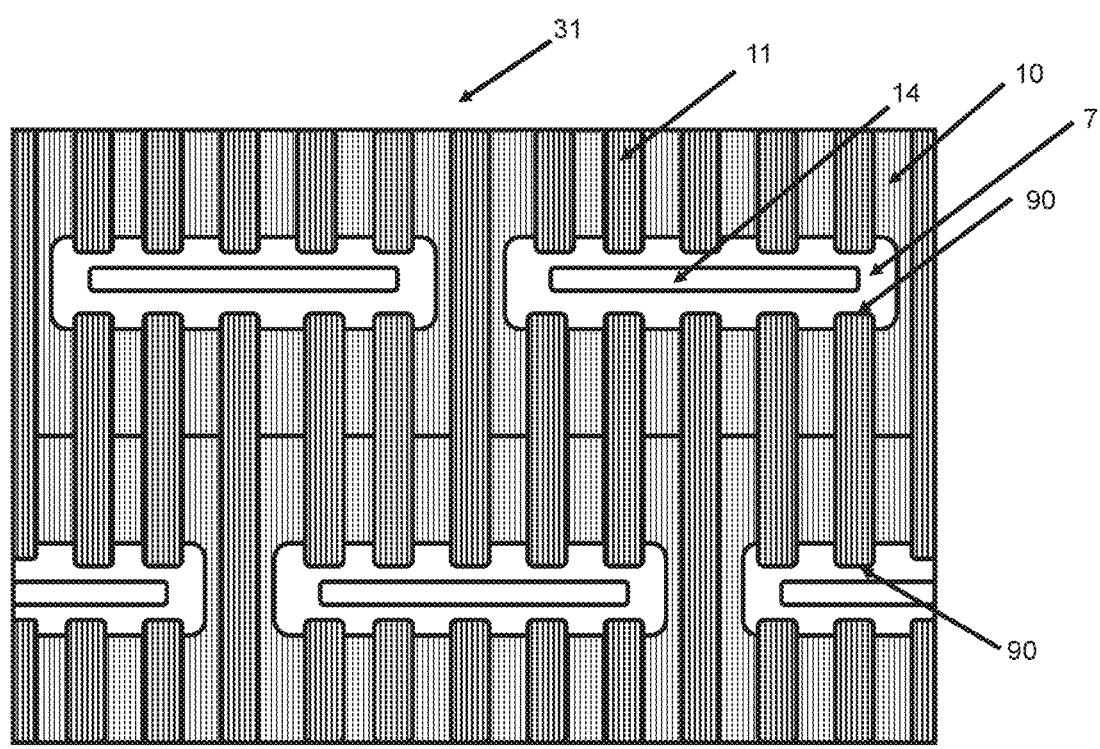
FIGS. 12A-B: show the top views of a sixth and seventh exemplary embodiments, with a plurality of contiguous or interrupted first gate electrodes, and a planar second gate electrode.
Figure 12B:
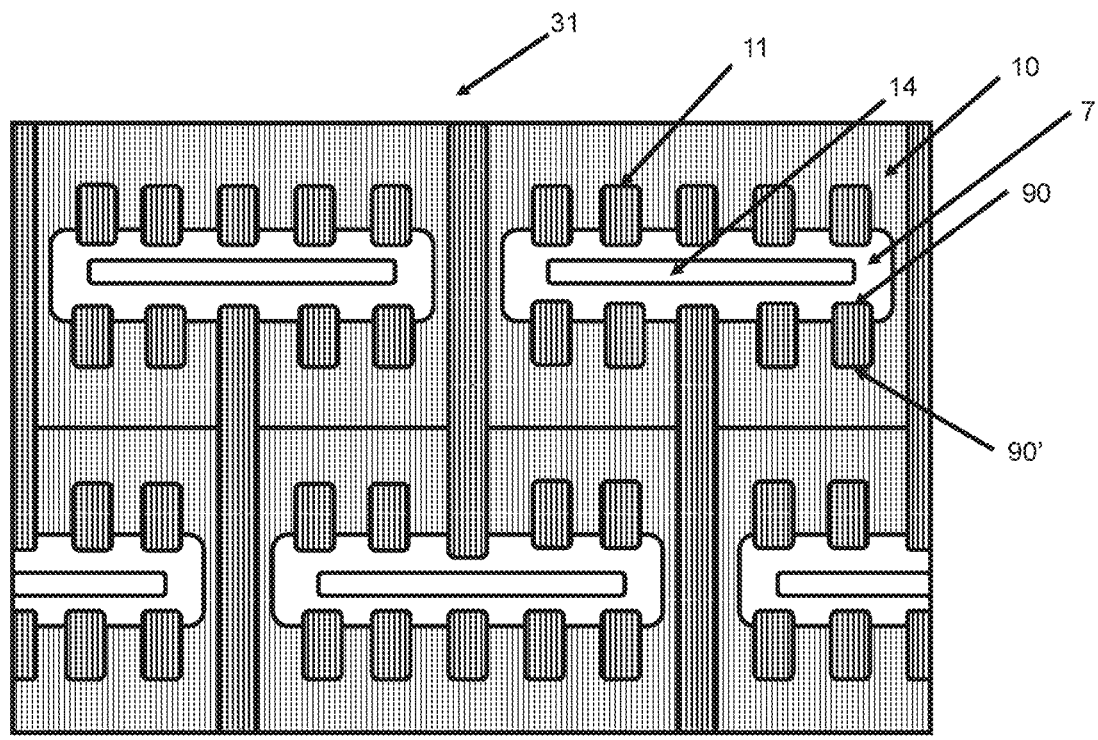

FIG. 12A depicts a sixth exemplary embodiment, wherein a planar second gate electrode 10 is formed on the emitter surface 31 of the drift layer 4. The second gate electrode 10 acts as an interconnecting layer for the plurality of first gate electrodes 11, thus no additional gate runners 11' are required. The trench regions embedding the first gate electrodes 11 can be continuous as depicted in FIG. 12A, meaning that both trench end walls 90 of the trench regions are abutting source regions 7. The trench regions embedding the first gate electrodes 11 can also be interrupted, as depicted in FIG. 12B showing a seventh exemplary embodiment, wherein a first end 90 of the trench region is abutting a source region 7, and the second end 90' of the same trench region is formed in the drift layer 4. The main advantage of having interrupted first gate electrodes 11 resides in reducing the overall capacitance of the semiconductor device.

Figure 13A:
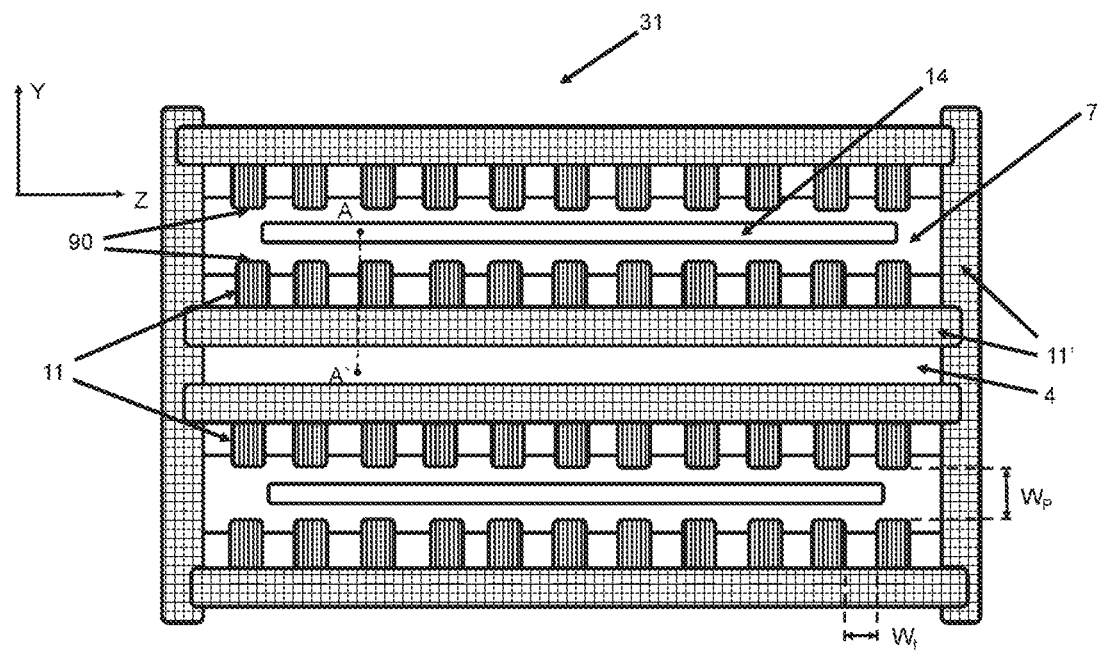
FIG. 13A: shows the top view of an eighth exemplary embodiment with gate runners and interrupted first gate electrodes.
Figure 13B:
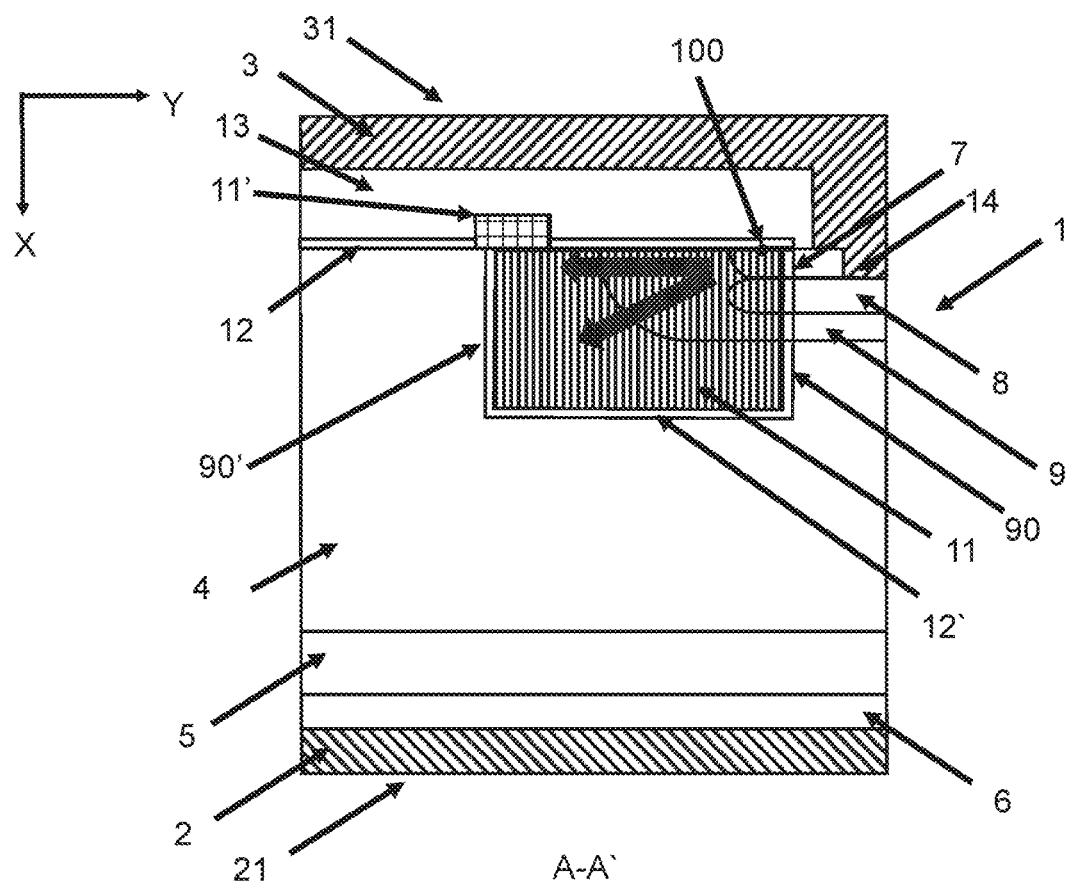
FIG. 13B: shows the cross section of the eighth exemplary embodiment along the cut line A-A' in FIG. 13A, for the case of the gate runner implemented as a planar electrode.
Figure 13C:
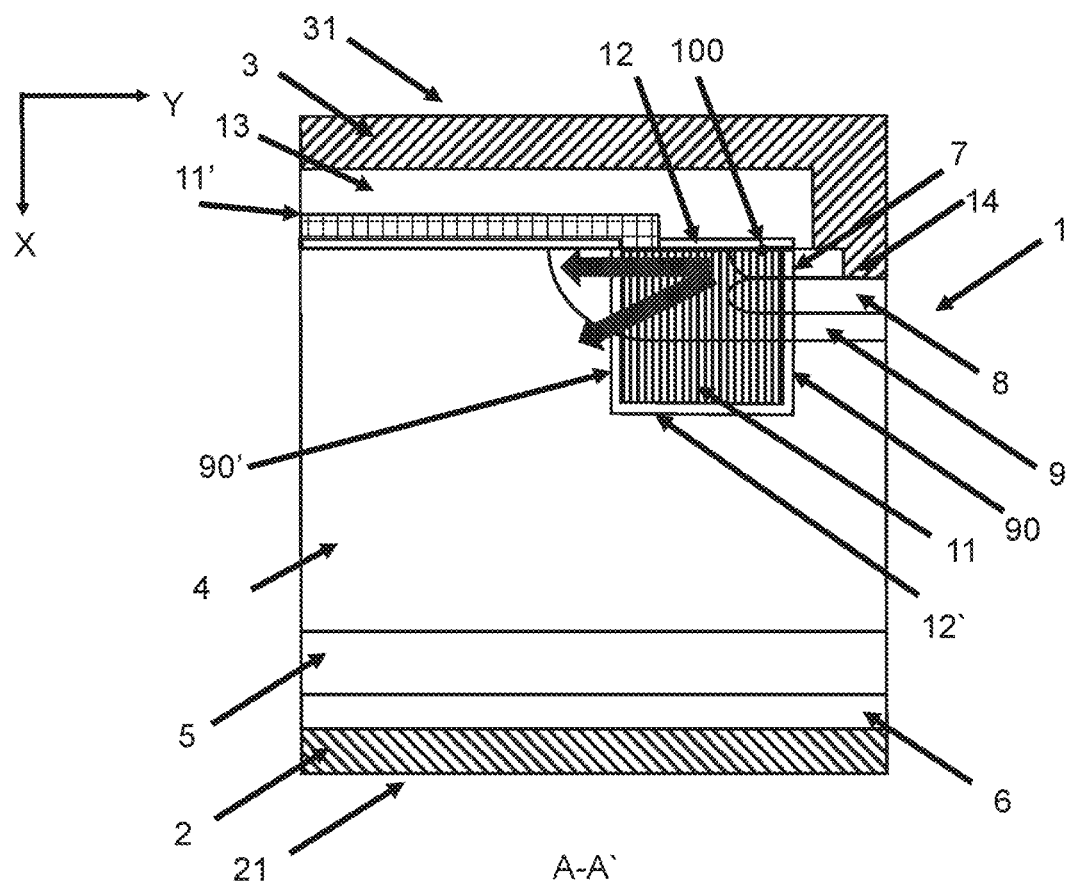
FIGS. 13C-F: show the cross section of additional variations on the eighth embodiment, with the gate runner implemented as planar electrode, and the first gate electrodes embedded in the first base layer.
Figure 13D:
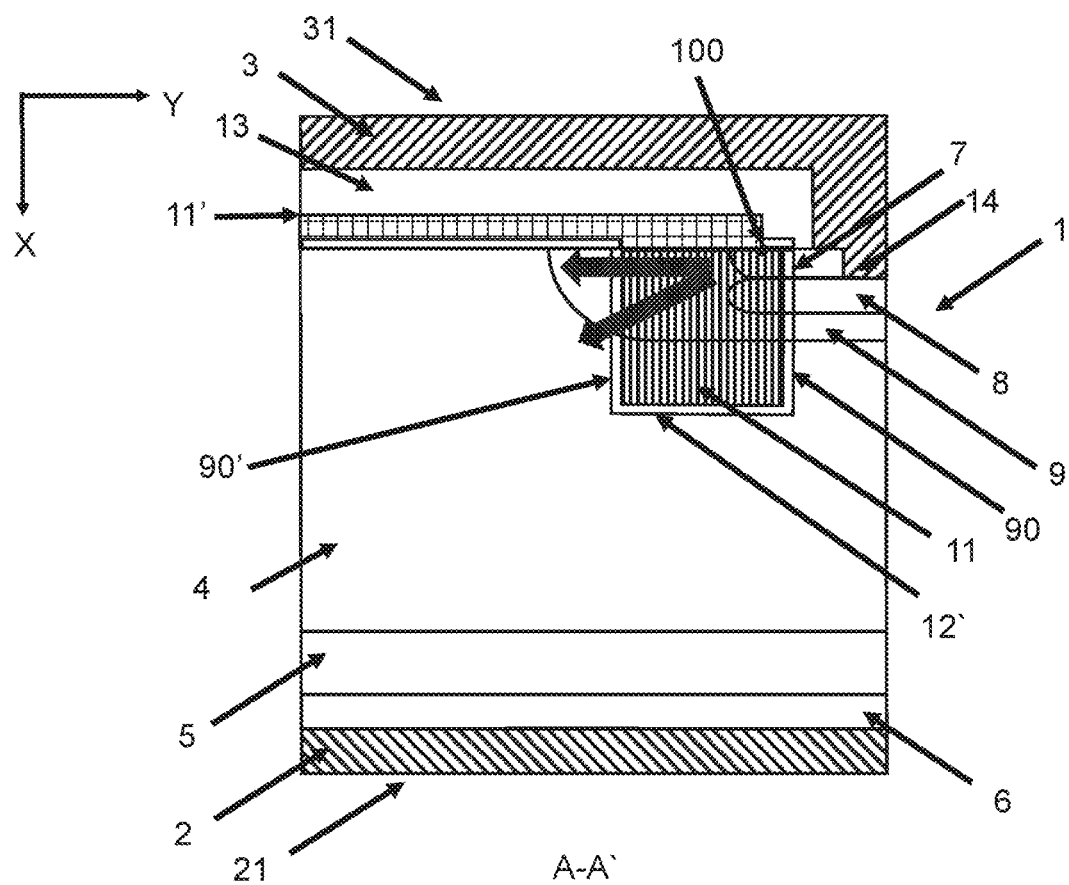
Figure 13E:
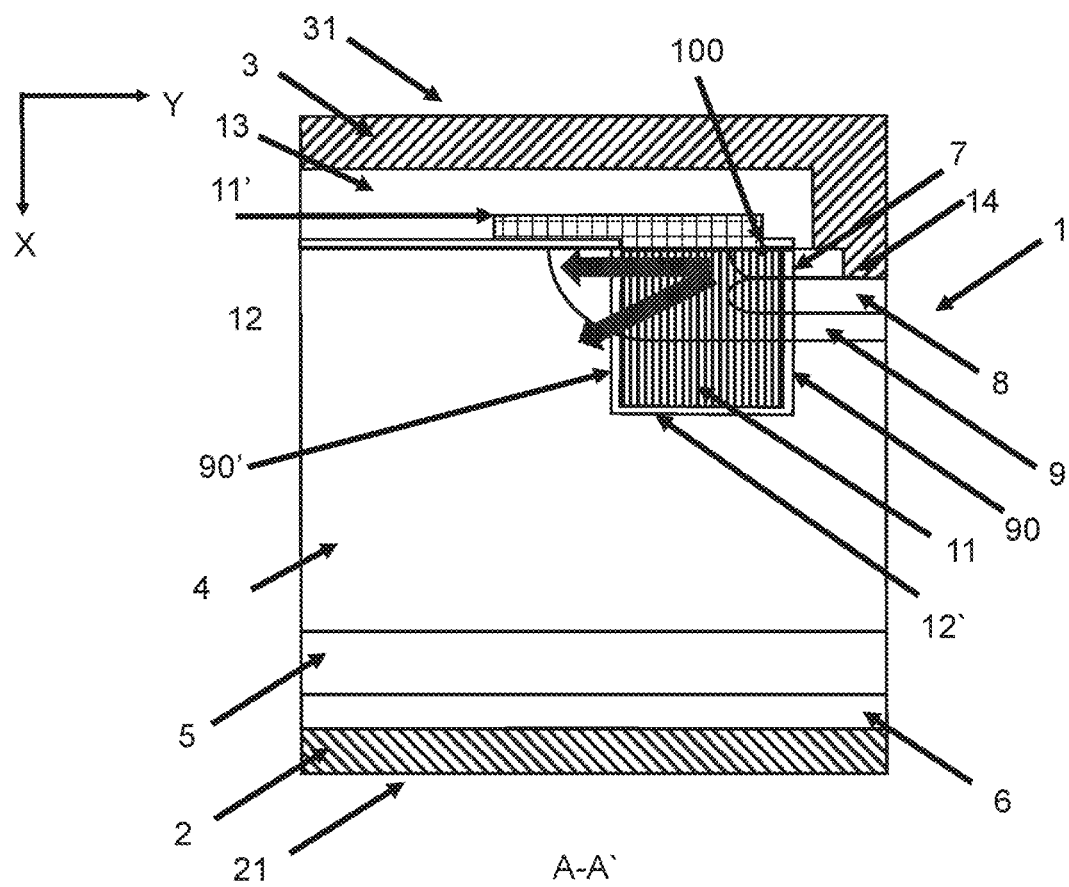
Figure 13F:
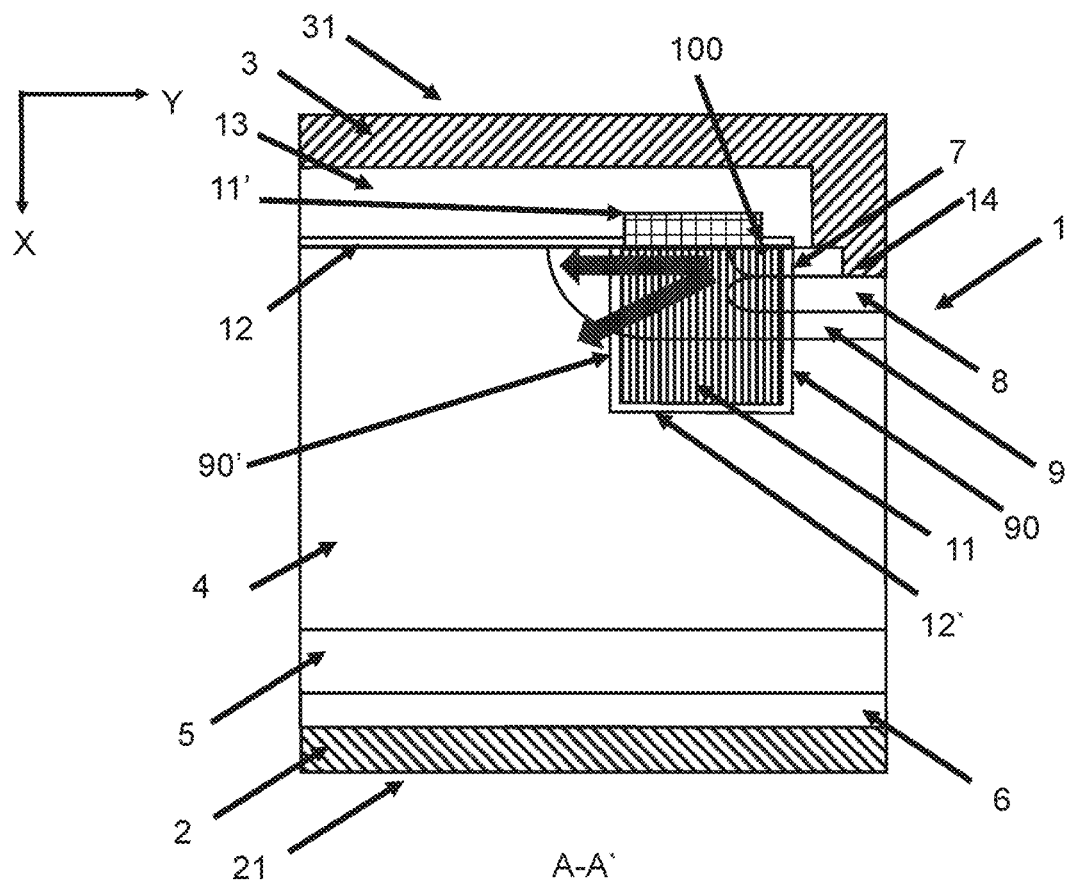

A further eighth exemplary embodiment is depicted in FIG. 13A, wherein the multi-cell arrangement includes source regions 7 shaped as stripes, and first gate electrodes 11 interrupted in their longitudinal direction. This arrangement is more clearly understood in FIG. 13B and reduces the gate-collector capacitance of the multi-cell transistor arrangement. Similar as the trench end wall 90, the trench end wall 90' can be also formed within the first base layer 9 as depicted in FIGS. 13C-F. The additional variations indicated in the FIG. 13C to 13F depict arrangements of the gate runners 11' as planar electrodes, contacting the first gate electrodes 11, and overlapping the first base layer 9 in different configurations.

Figure 14:
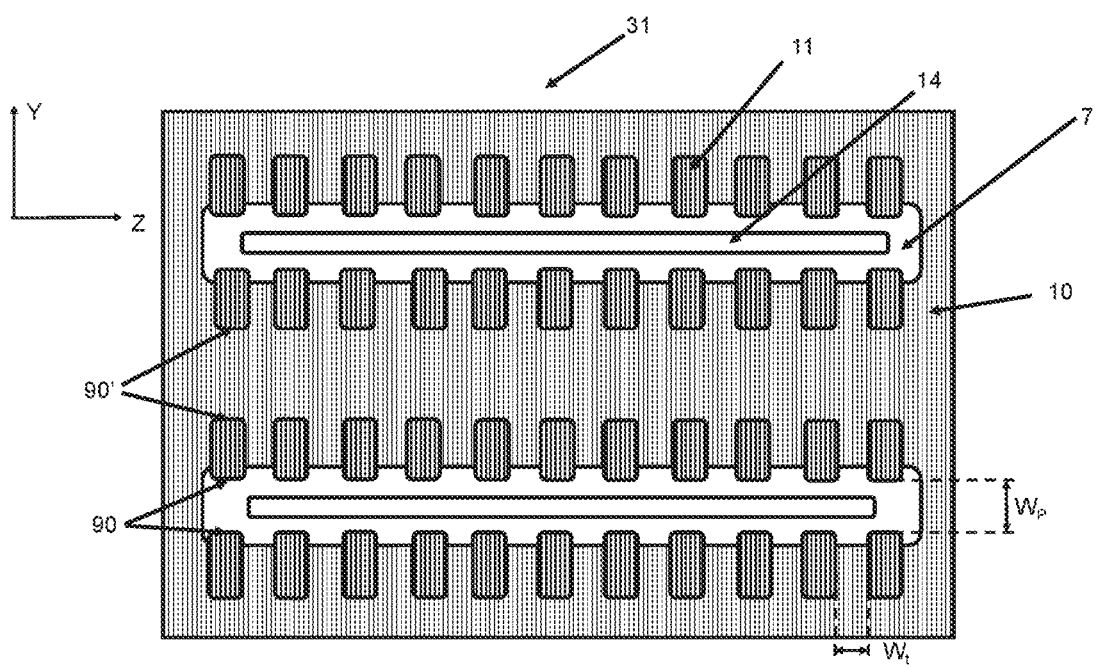
FIG. 14: shows the top view of a nineth exemplary embodiment.

A ninth exemplary embodiment depicted in FIG. 14, wherein the source regions 7 are shaped with stripes, the first gate electrodes 11 are interrupted along their longitudinal direction, and a planar second gate electrode 10 is formed on the emitter side 31 interconnecting the plurality of first gate electrodes 11.

With respect to the FIGS. 13A and 14, the critical design aspects are the dimension $W_t$ or mesa between the trenches in the Z direction, as well as the dimension $W_p$ representing the distance from a trench end wall 90 of a first gate electrode 11 to a trench end wall 90 of the adjacent first gate electrode in the Y direction. Improved carrier storage/reduced hole drainage is expected as the dimensions $W_t$ and $W_p$ are reduced. The value of $W_t$ may be in a range from about 5 μm to below 0.1 μm, more preferably from 1 μm to 0.1 μm—which is achievable with the proposed design because no additional structures have to be lithographically defined in between the trench recesses of the first gate electrodes 11. Also, improved carrier storage/reduced hole drainage is expected by reducing the distance $W_p$. More specifically, $W_p$ could extend approximately in a range from about 20 μm to about 1 μm, preferably from 5 μm to 1 μm, and more preferably from 2 μm to 1 μm.

Figure 15:
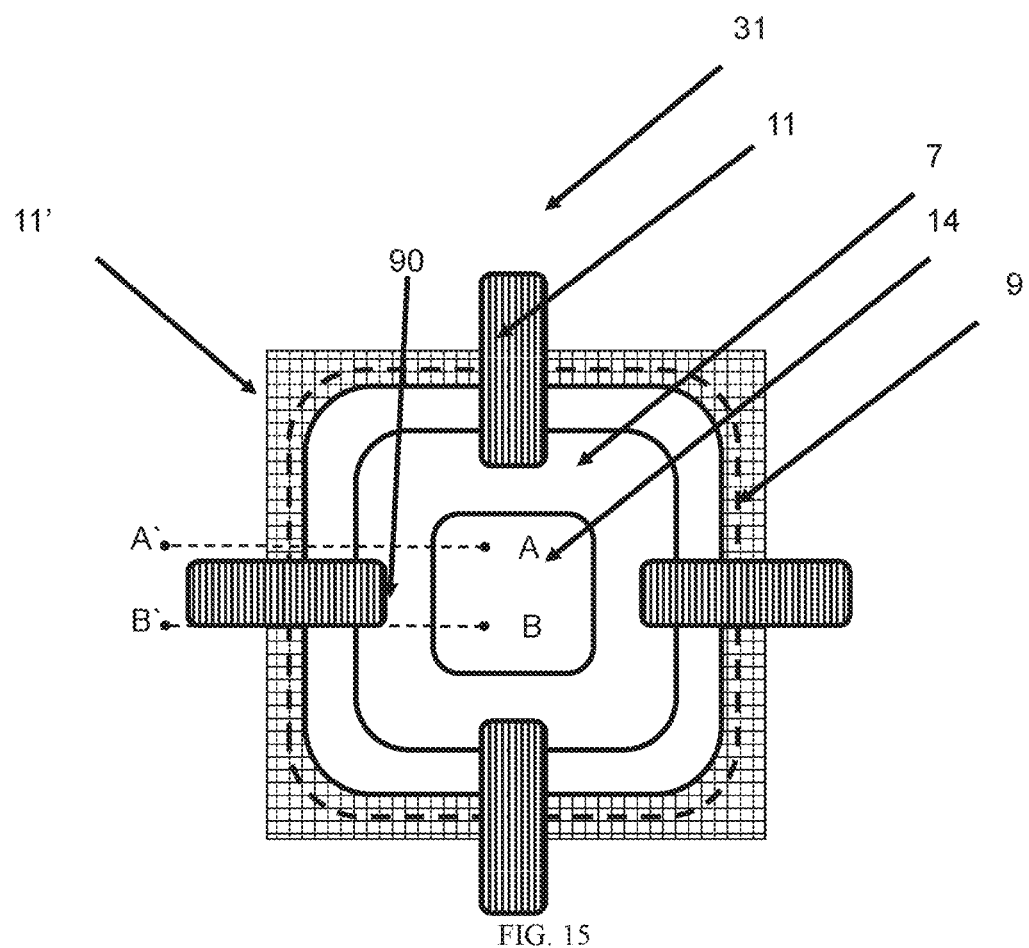
FIG. 15: shows a top view of a tenth exemplary embodiment, wherein the gate runner intersects the first base layer.
Figure 16A:
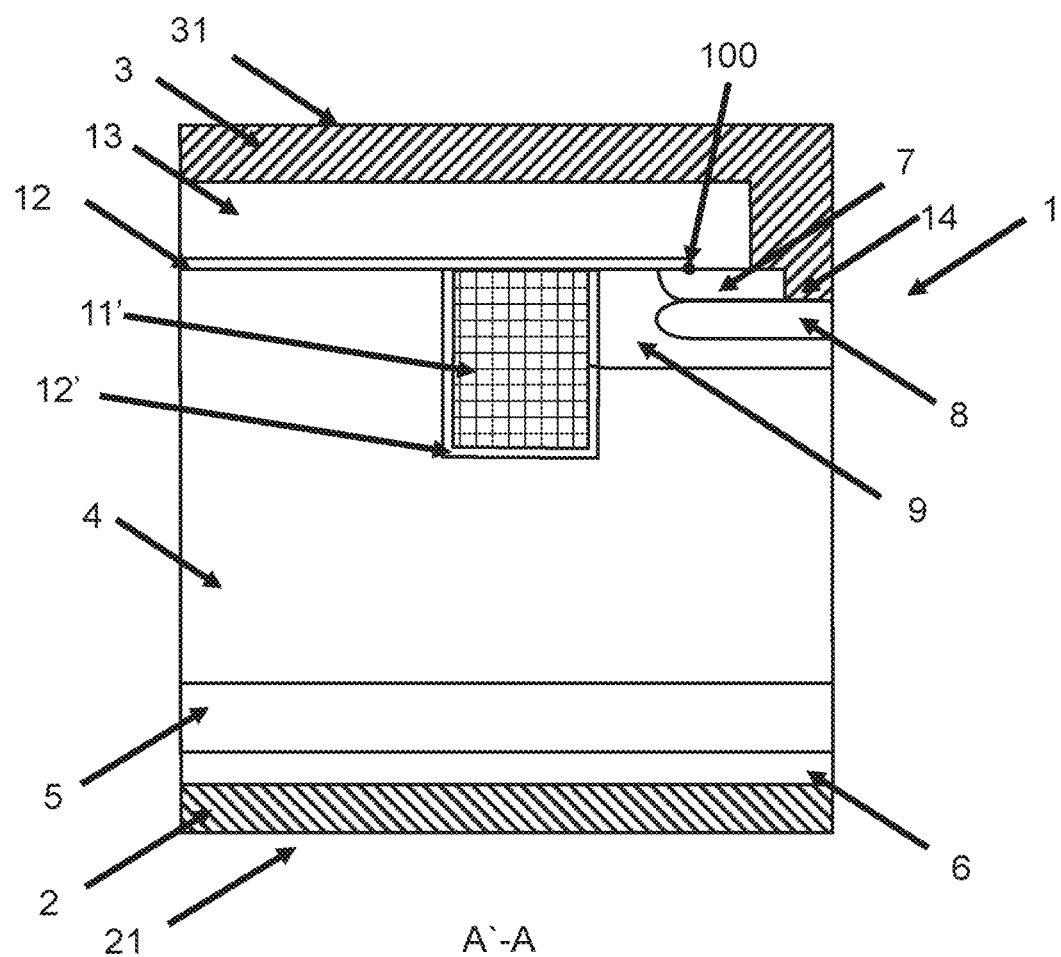
FIGS. 16A-B: show cross sections of the tenth embodiment along the cut-lines in FIG. 15.
Figure 16B:
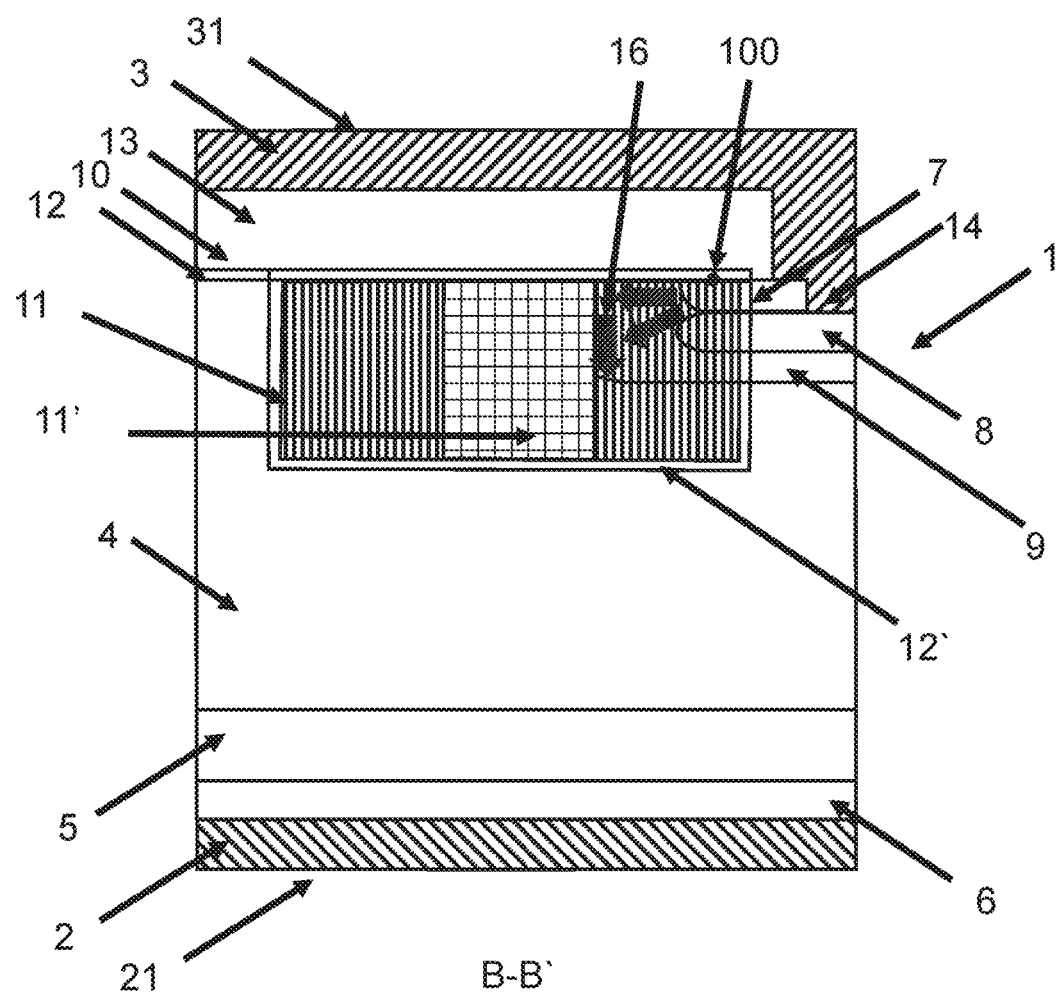

Previous exemplary embodiments depicted the use of gate runners 11' formed outside of the first base layer 9, i.e., not abutting the first base layer 9. However, it would be possible to have a layout wherein, the gate runner 11' is formed abutting the first base layer 9, as depicted in the tenth exemplary embodiment of FIG. 15. This is more clearly understood in the cross sections depicted in FIGS. 16A and 16B, for the case where the gate runner 11' is formed with a trench recess. It is also possible to substantially embed the trench recess of the gate runner 11' in the first base layer 9 by reducing its geometrical dimensions (not shown).

Figure 17B:
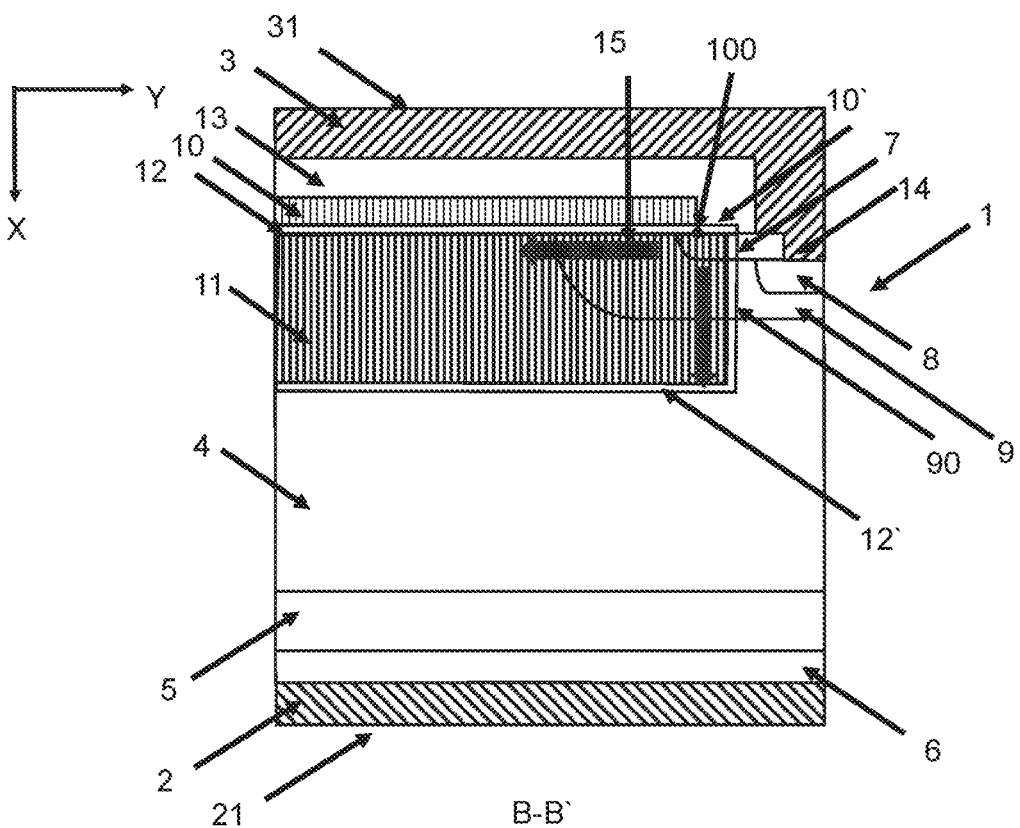

FIGS. 17A-B depict cross sections through an eleventh exemplary embodiment of the invention, wherein a separation region 60 with a length greater than zero spaces apart, in the Y direction, the first edge of the second base layer 8, from the singular point 100 of the source region 7. As explained previously, this distance can be negative or positive. When it is positive, it means that the second base layer 8 does not fully protect the bottom side of the source region 7 as indicated in the FIG. 17A. In this eleventh embodiment, the trench recesses of the first gate electrodes 11 abut the source region 7, but not the second base layer 8. In a similar manner to the first exemplary embodiment, an inversion layer can be formed on the lateral trench walls 40, and on the first end wall 90 of the trench regions in contact with the first base layer 9. This significantly increases the width of the MOS channel. However, when the length of the separation region 60 is greater than 0, the highly doped second base layer 8 does not fully protect the bottom side of the source region 7, which may create issues with the Reverse Blocking Safe Operating Area (RB-SOA), i.e., the source region 7 may become forward biased, and may inject electron charge carriers in the drift layer 4, leading to a latch up phenomena.

Figure 18:
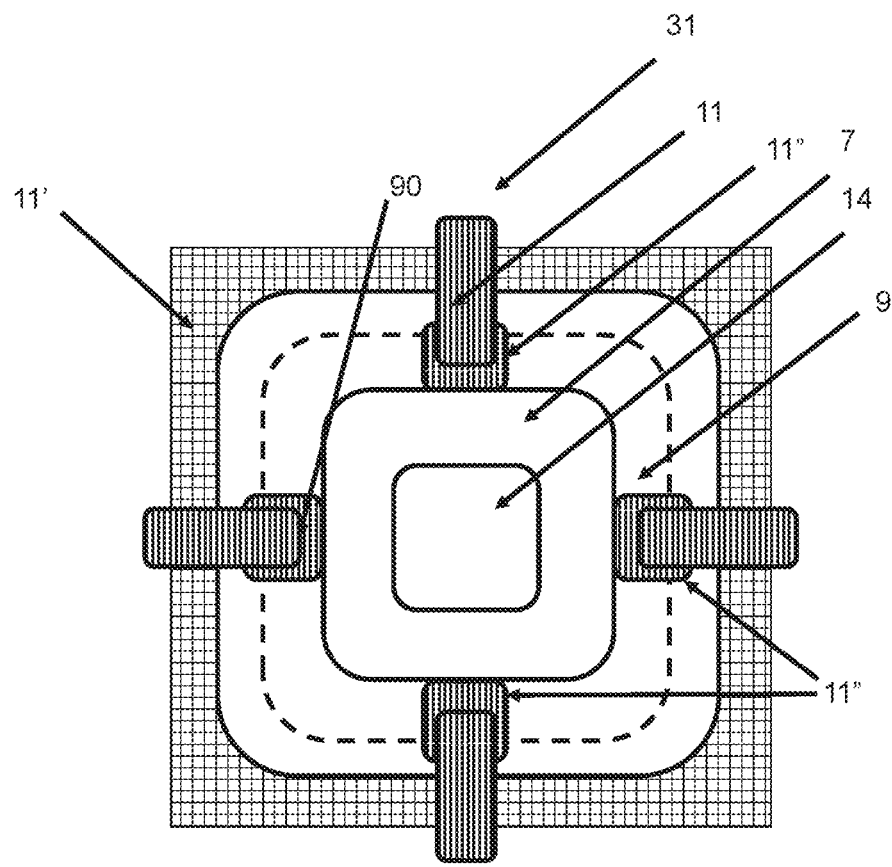
FIG. 18: shows a top view of a twelfth exemplary embodiment, wherein the trench recesses of the first gates do not abut the source region. A planar extension of the first gate electrode is required to form a proper MOS channel.

In previous exemplary embodiments, the first end 90 of the trench recesses of the first gate electrodes 11 was abutting the source region 7. It is also possible that the first end 90 of the trench recesses does not abut the source region 7. FIG. 18 shows a twelfth exemplary embodiment, wherein an additional planar extension region 11" of the first gate electrodes 11 is required to ensure the formation of a MOS channel between the source region 7, the first base layer 9, and the drift layer 7. The additional gate runner 11' is used to ensure the electrical connectivity between the plurality of the first gate electrodes 11.

Figure 19:
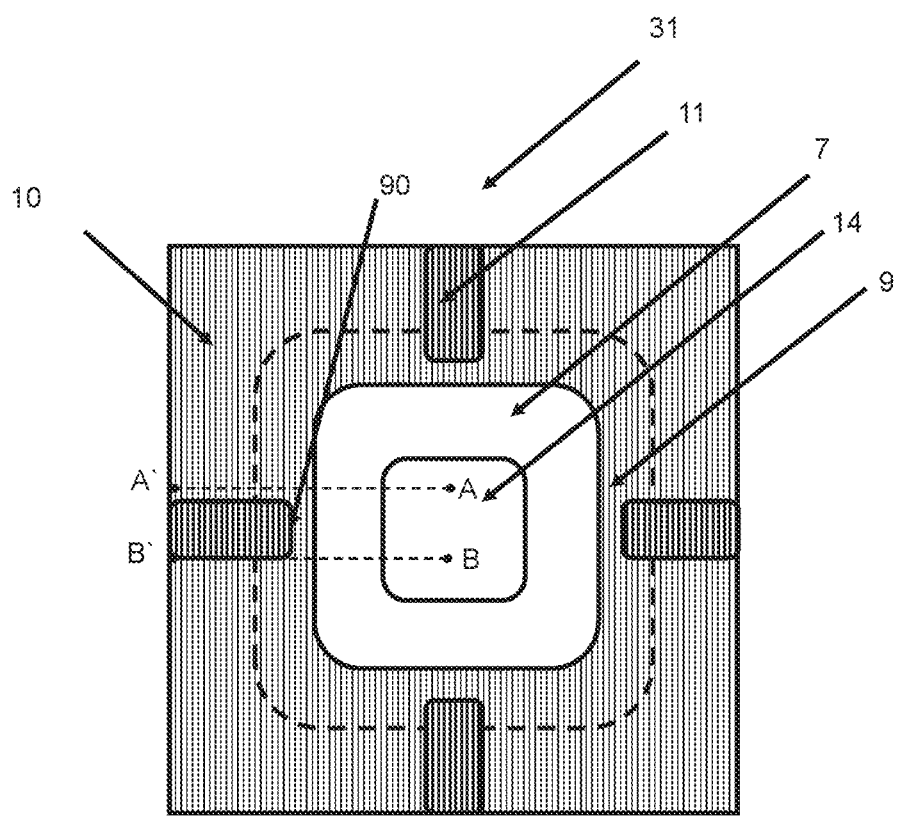
FIG. 19: shows a top view of a thirteenth exemplary embodiment.
Figure 20A:
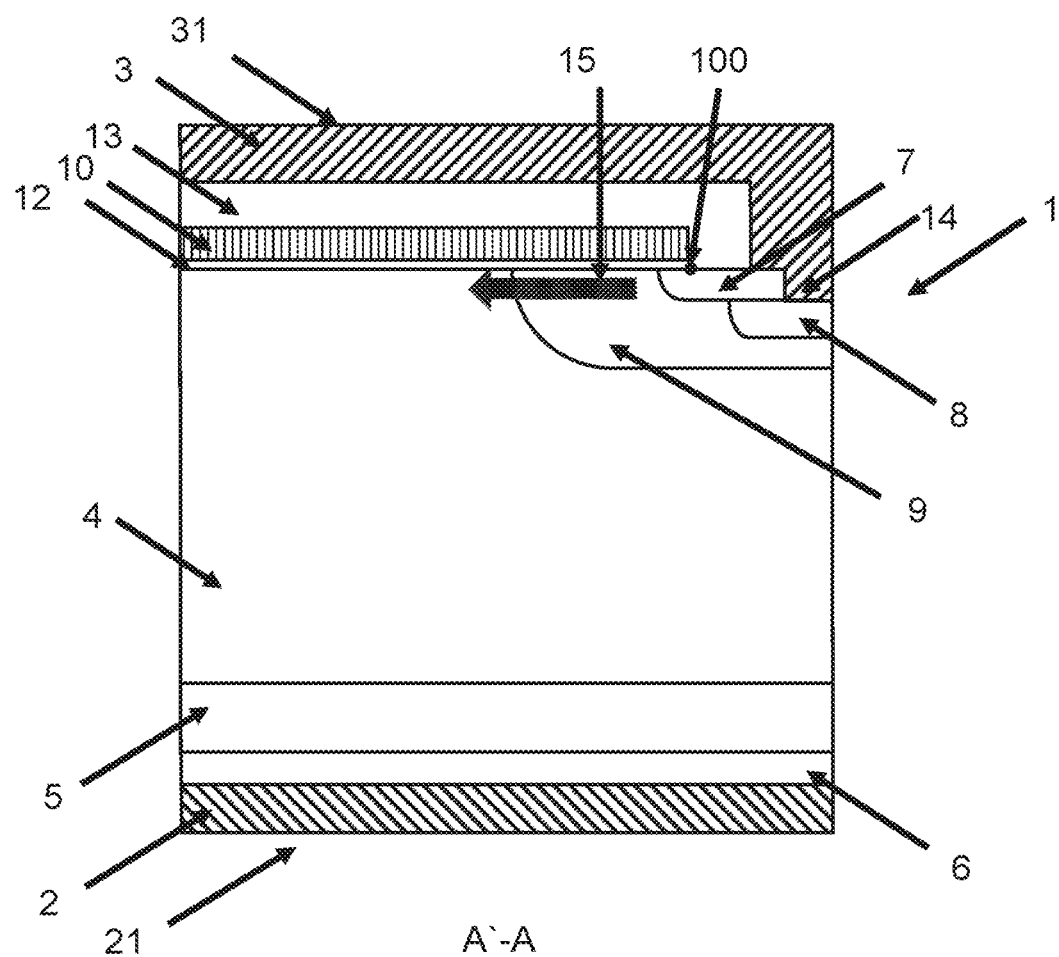
FIGS. 20A-B-: show the cross sections of the thirteenth exemplary embodiment along the cutlines in FIG. 19.
Figure 20B:
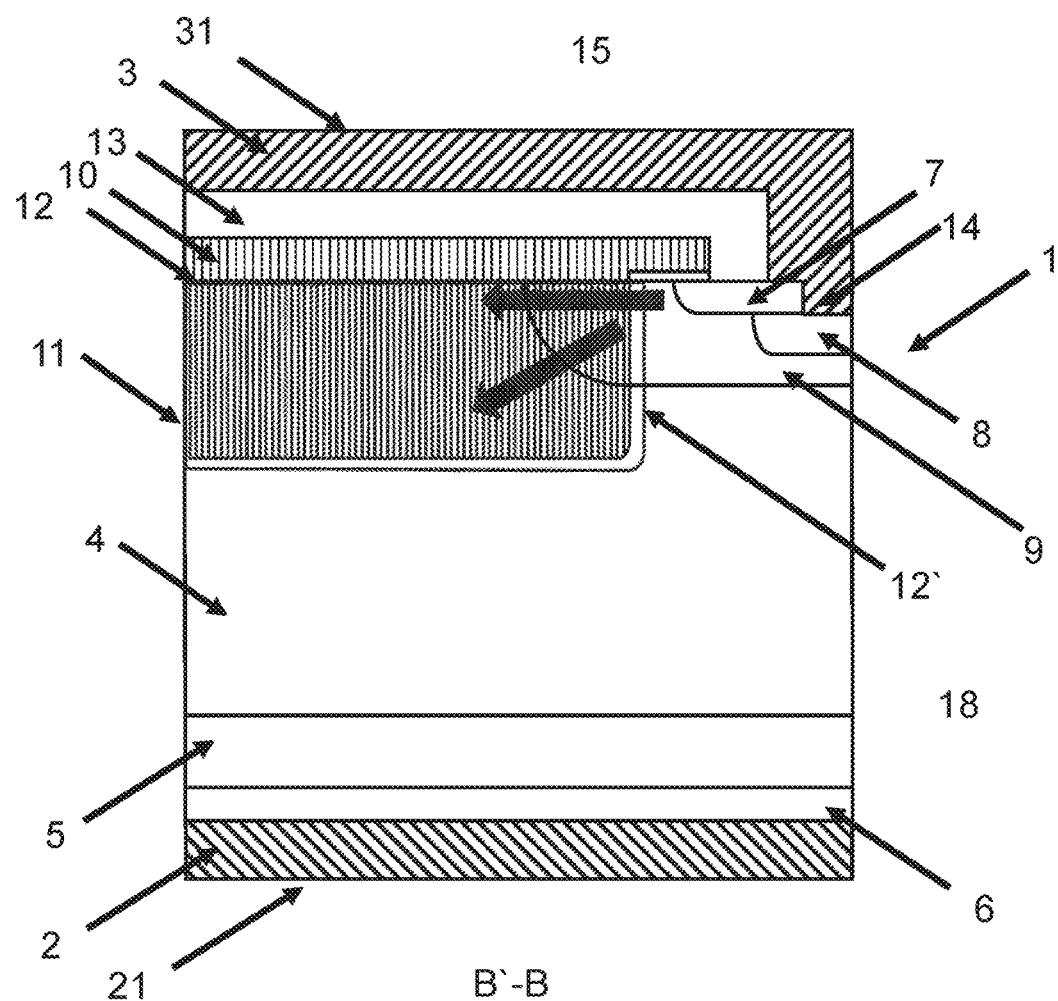

Alternatively, and requiring a simplified method of processing as for the twelfth embodiment, the FIG. 19 shows a thirteenth exemplary embodiment, wherein a planar second gate electrode 10 is formed on the emitter side 31 of the drift layer 4, and connects electrically the first gate electrodes 11. The advantage of the thirteenth exemplary embodiment is better understood in FIG. 20A-B, depicting cross sections of an active cell with a planar MOS channel 15, in addition to MOS channels formed on the lateral walls of the trench recesses of the first gate electrodes 11. The planar second gate electrode 10 can be used as a mask for ion implantation steps when forming the first base layer 9 and the source region 7.

Figure 21:
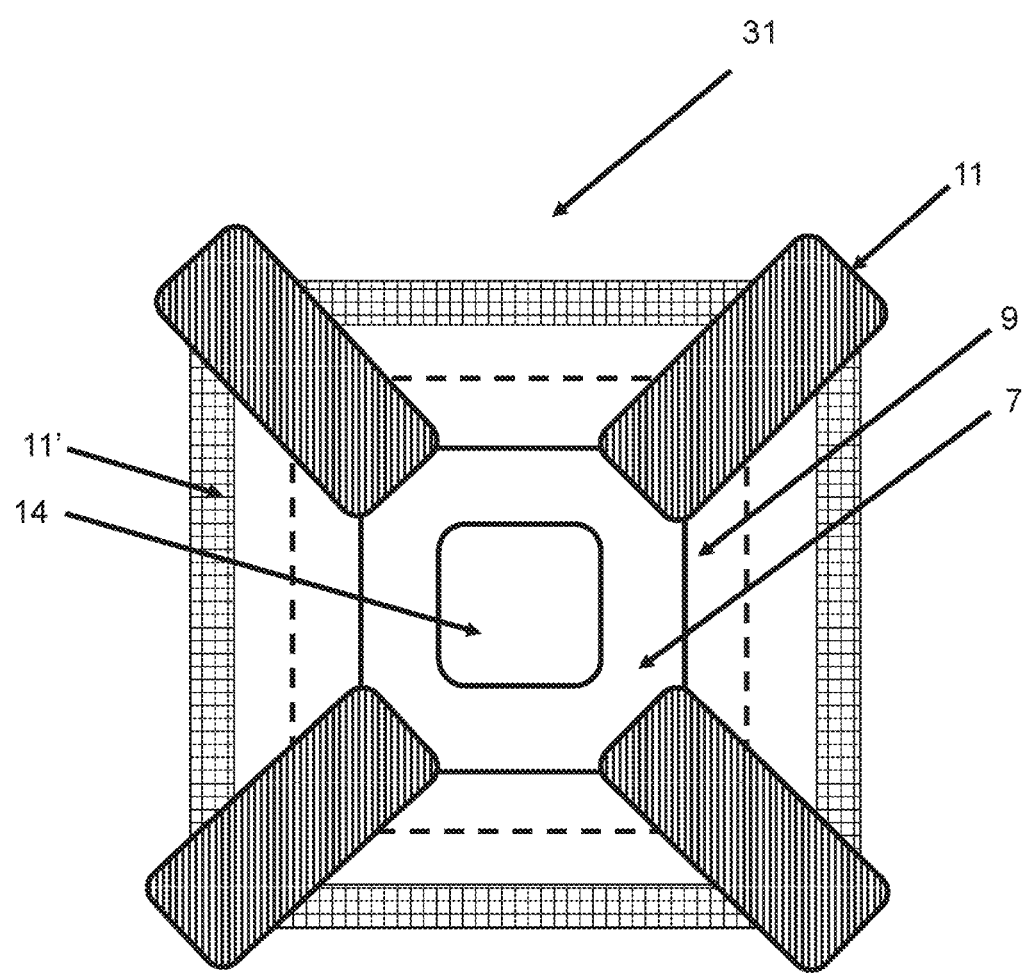
FIG. 21: shows a top view of a fourteenth exemplary embodiment.
Figure 22:
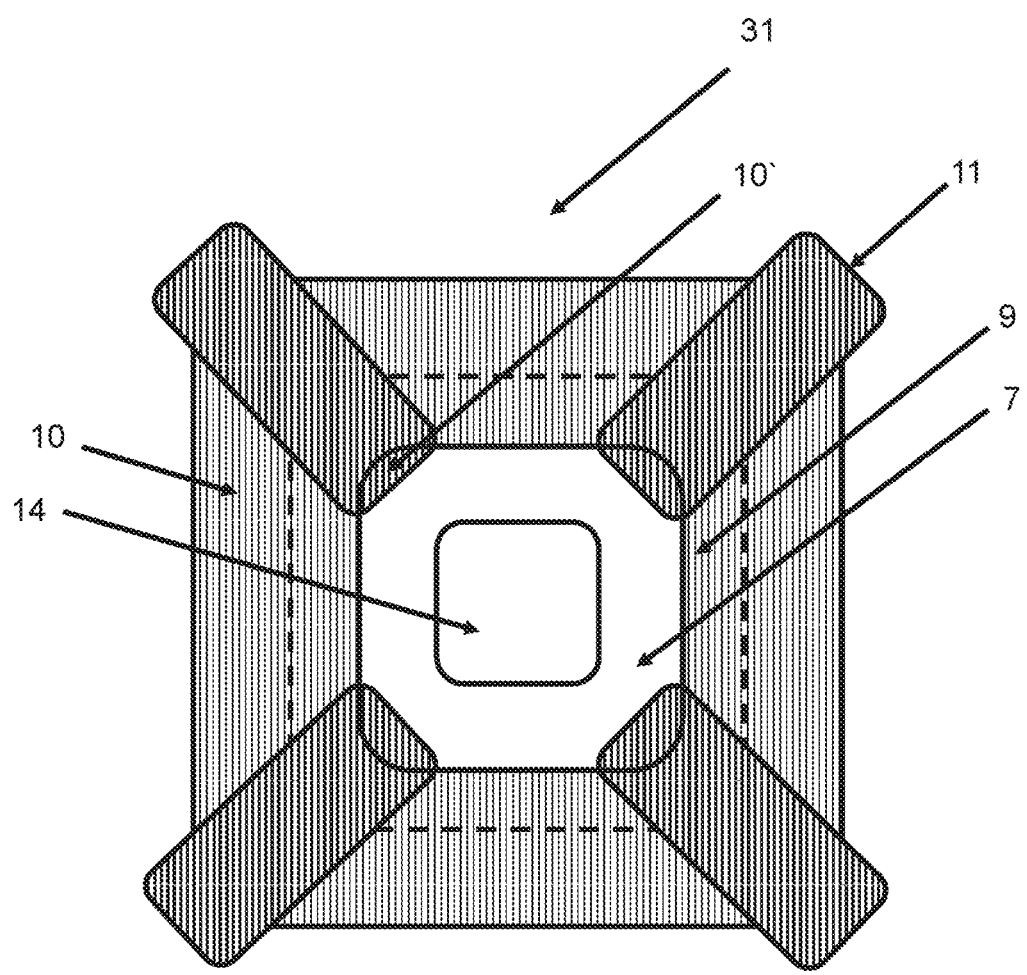
FIG. 22: shows a top view of a fifteenth exemplary embodiment.

FIG. 21 depicts a fourteenth exemplary embodiment, which is similar to the first exemplary embodiment with the exception of the direction of the first gate electrodes 11. In the fourteenth exemplary embodiment, the first gate electrodes 11 are formed in such a manner that they intersect the corners of the square shape defining the source region 7 in the top view plane. This may provide certain benefits if the drift layer 4 is formed of materials with strong dependence between their electrical properties and the crystallographic directions, such as Silicon Carbide. FIG. 22 depicts a fifteenth exemplary embodiment, wherein a planar second gate electrode 10 is formed on the surface of the emitter side 31, and replaces the additional gate runners 11' from FIG. 21.

Figure 23:
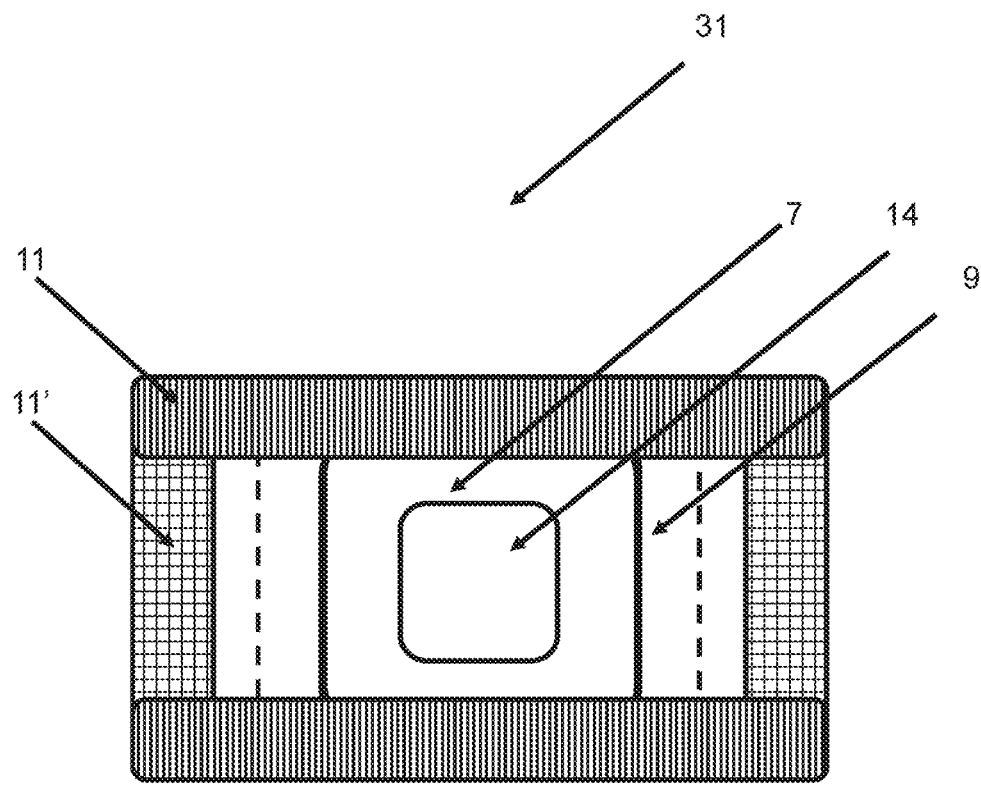
FIG. 23: shows a top view of a sixteenth exemplary embodiment.
Figure 24:
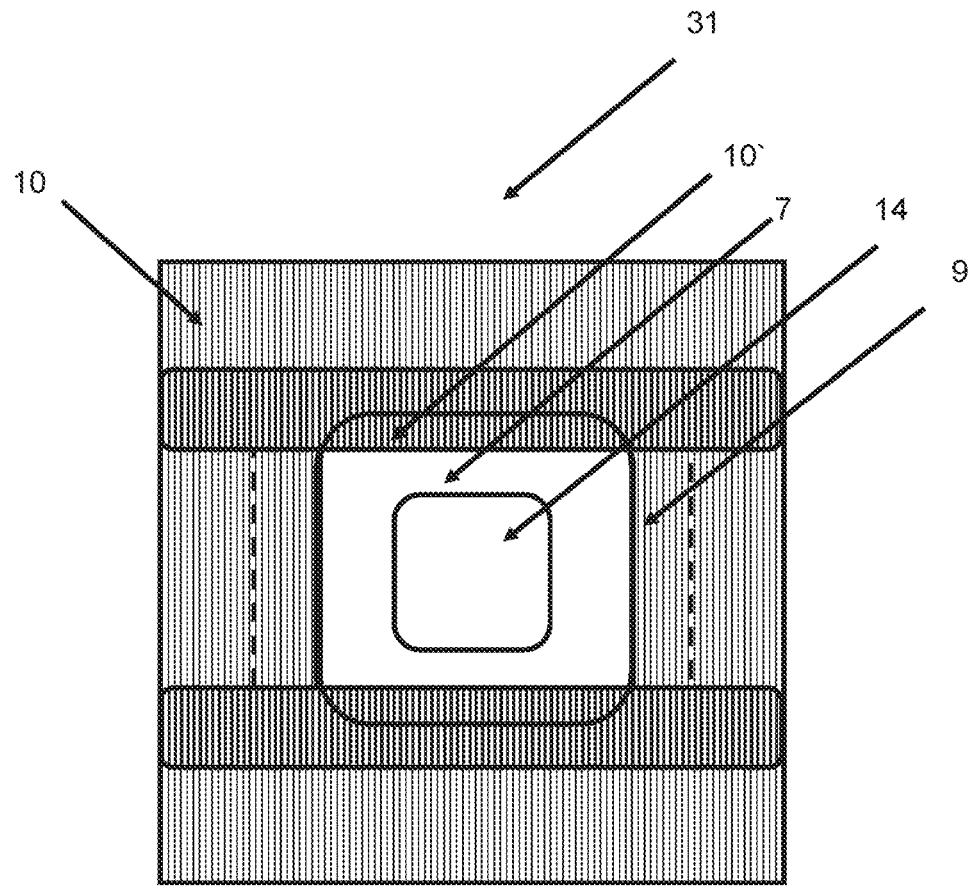
FIG. 24: shows a top view of a seventeenth exemplary embodiment.

FIG. 23 shows a sixteenth exemplary embodiment of a transistor active cell, wherein the gate runner 11' abuts two adjacent, non-interrupted first gate electrodes 11. However, it should be understood that the first gate electrodes 11 can be interrupted in a region further away from the active cell, i.e., further away from the source region 7, first base layer 9, and second base layer 8. FIG. 24 depicts a seventeenth exemplary embodiment, wherein a planar second gate electrode 10 is formed on the surface of the emitter side 31, and replaces the additional gate runner 11' from FIG. 23.

As explained previously, multiple active cells must be arranged on a semiconductor wafer of a starting material to form a fully functional semiconductor device. In addition to the active cells, the fully functional semiconductor device may comprise other regions, such as a junction termination region required for achieving voltage blocking capabilities.

Figure 25:
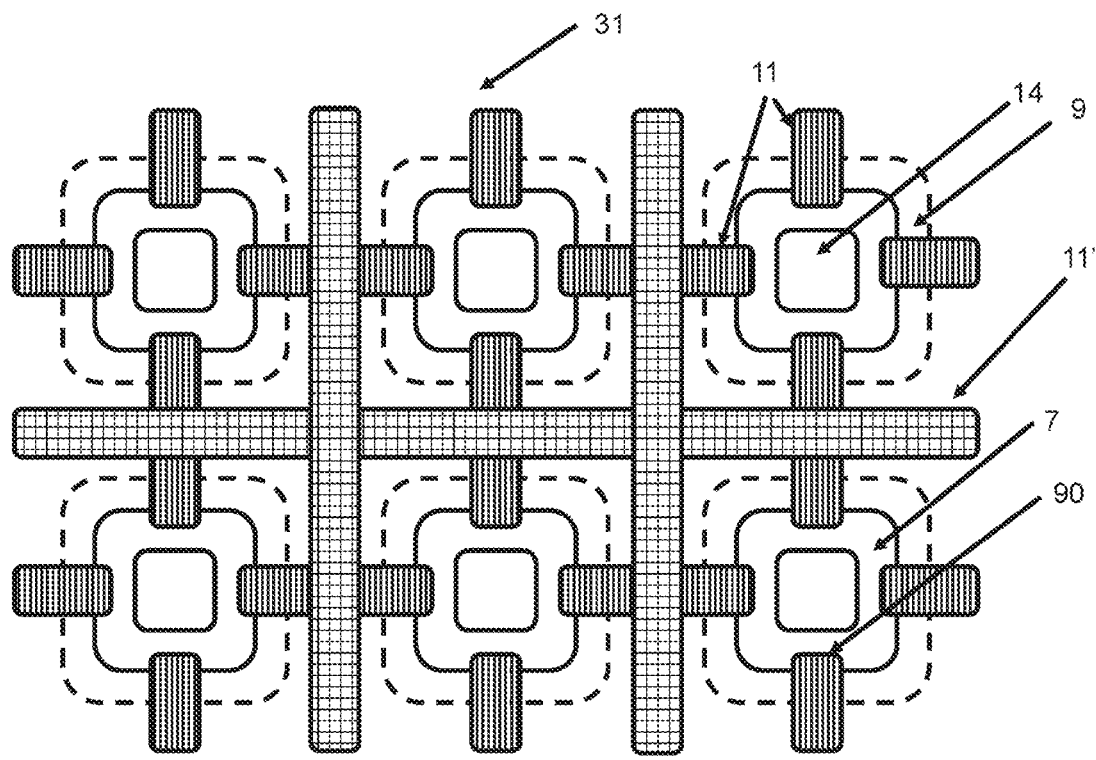
FIG. 25: shows a top view of a multi cell arrangement of transistor cells according to the first exemplary embodiment.
Figure 26:
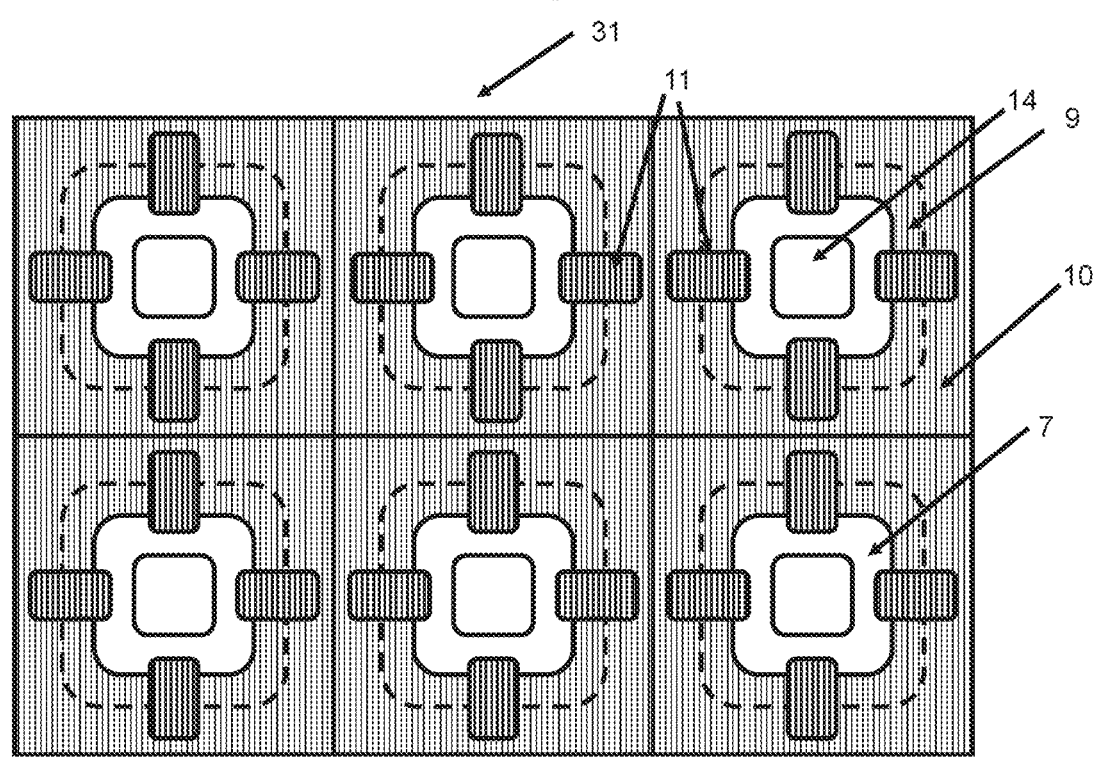
FIG. 26: shows a top view of a multi cell arrangement of transistor cells according to the fourth exemplary embodiment.
Figure 27:
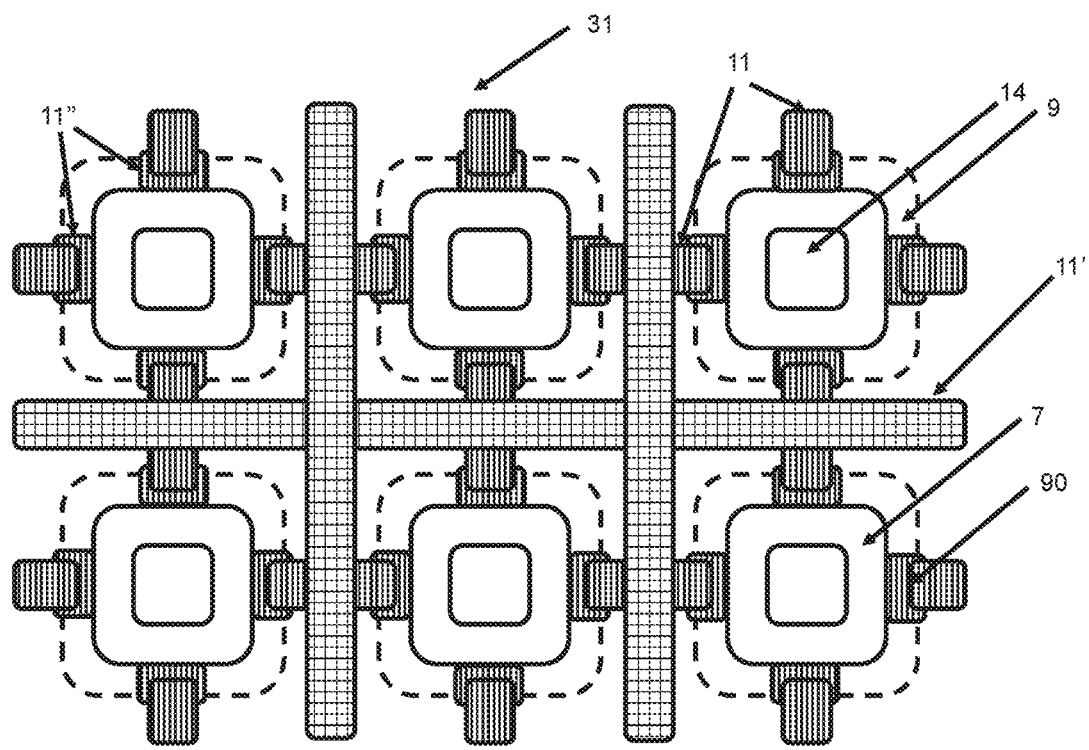
FIG. 27: shows a top view of a multi cell arrangement of transistor cells according to the twelfth exemplary embodiment.
Figure 28:
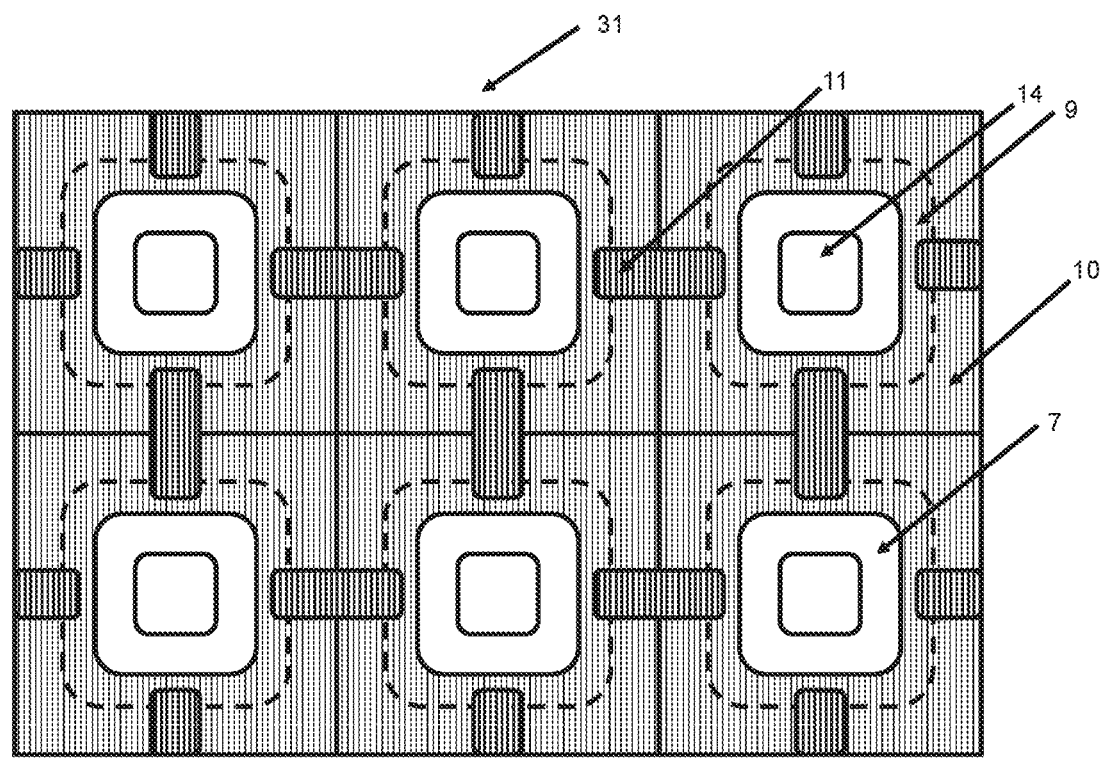
FIG. 28: shows a top view of a multi cell arrangement of transistor cells according to the thirteenth exemplary embodiment.

In terms of arranging multiple active cells, various layouts can be considered. For example, in addition to the stripe layouts depicted in FIG. 13A, FIG. 14, it can be possible to arrange square cells according to the first exemplary embodiment, in a regular cellular layout as depicted in FIG. 25, or FIG. 27, depending on, whether or not the first end 90 of the first gate electrodes 11 abuts the source region 7. Similarly, FIG. 26 and FIG. 28 depict square cell layouts for the case of using a planar second gate electrode 10, depending on whether or not the first end 90 of the first gate electrodes 11 abuts the source region 7, respectively.

Figure 29:
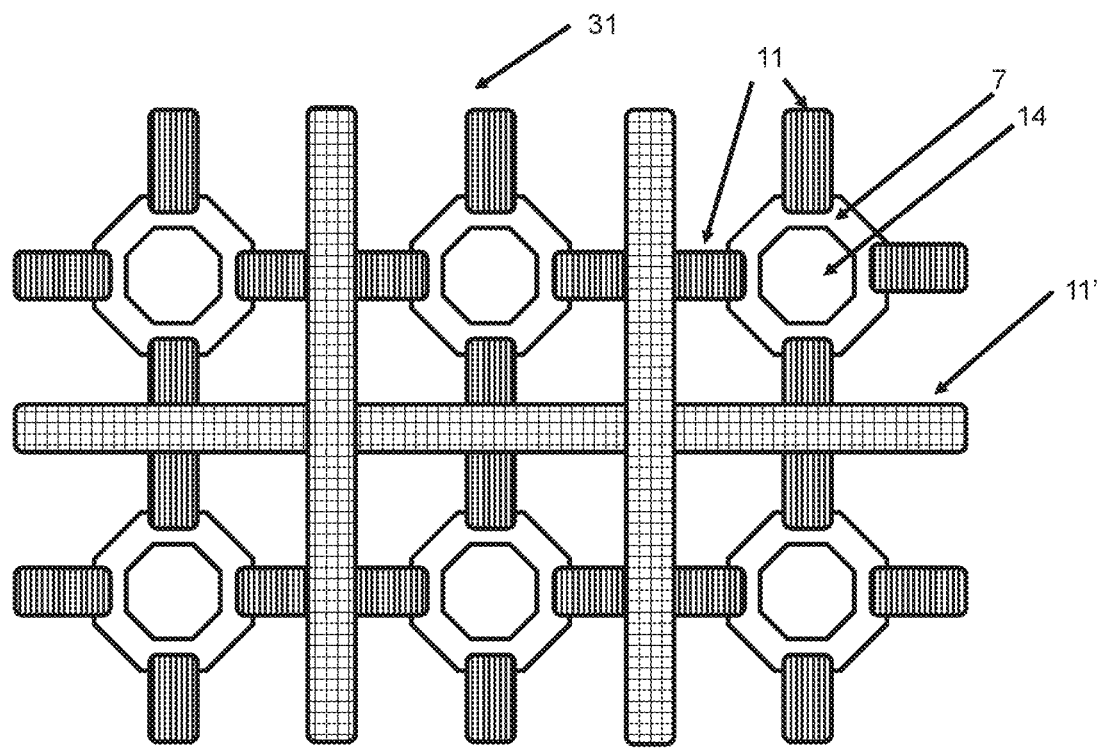
FIG. 29: shows a top view of an eighteenth exemplary embodiment comprising a multi cell arrangement of transistor octagonal cells.
Figure 31:
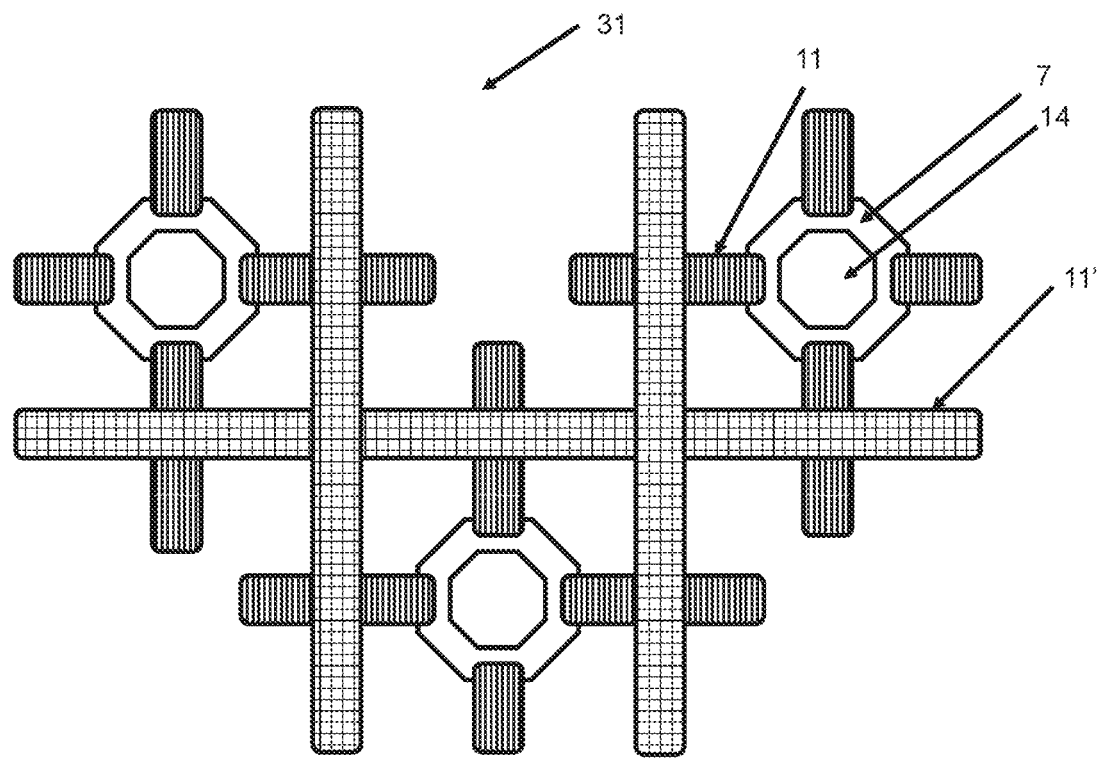
FIG. 31: shows a top view of a twentieth exemplary embodiment comprising a multi cell arrangement of transistor octagonal cells.

Furthermore, FIG. 29, 31, 33 show other exemplary embodiments of multi-cell arrangements of octagonal or hexagonal transistor cells, interconnected by an additional gate runner 11'. One of the benefits of such arrangements resides in the increased number of first gate electrodes 11, and implicitly an increase of the MOS channels that can be formed per unit area. In FIG. 31 for example, the number of octagonal active cells is reduced in comparison with FIG. 29, in order to better control the short circuit capability.

Figure 30:
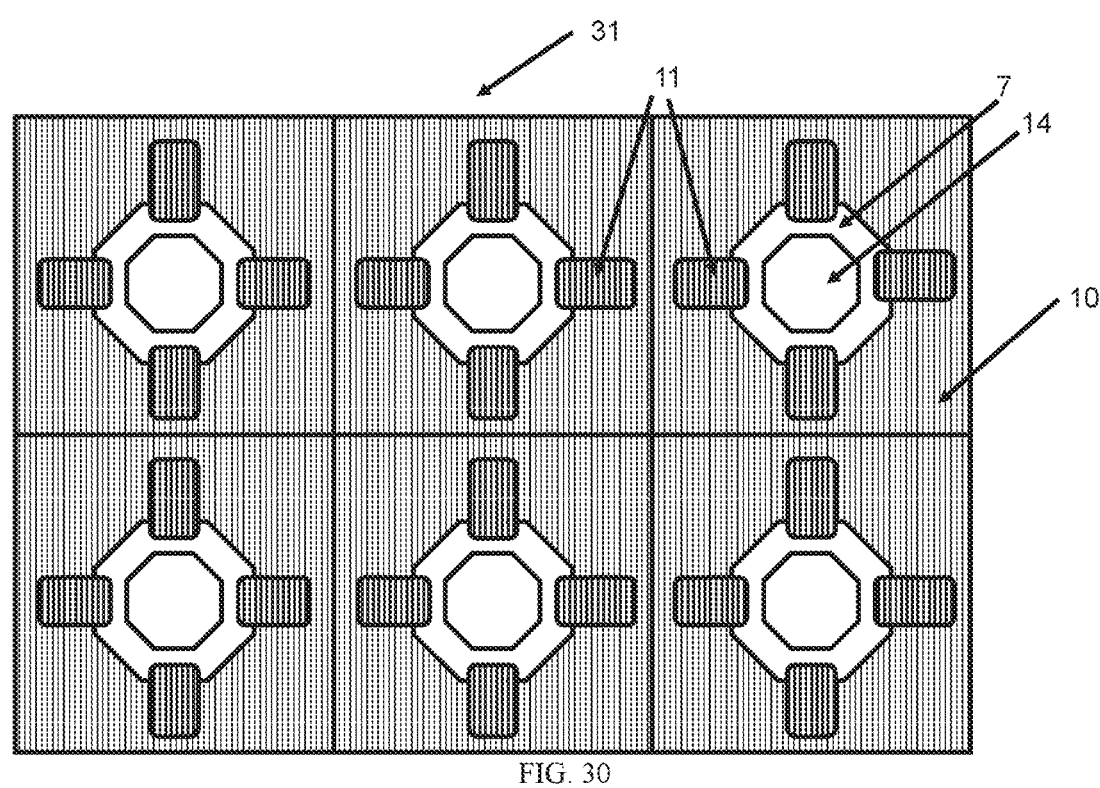
FIG. 30: shows a top view of a nineteenth exemplary embodiment comprising a multi cell arrangement of transistor octagonal cells.
Figure 32:
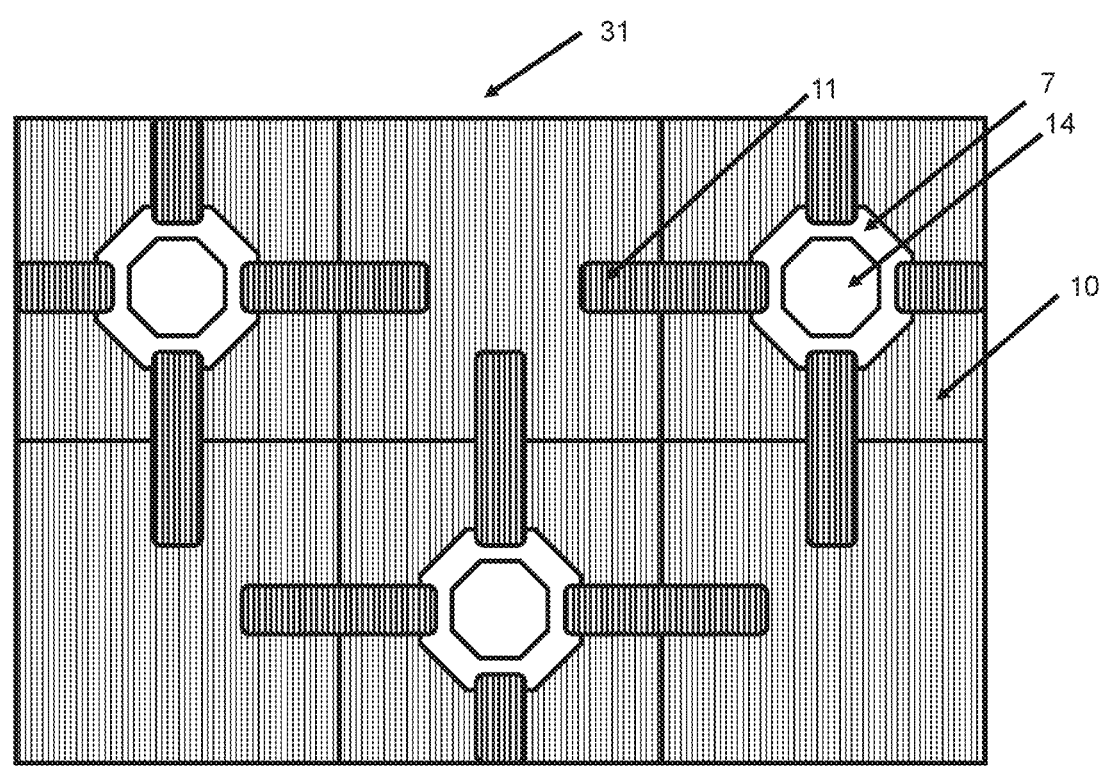
FIG. 32: shows a top view of a twenty-first exemplary embodiment comprising a multi cell arrangement of octagonal transistor cells.
Figure 33:
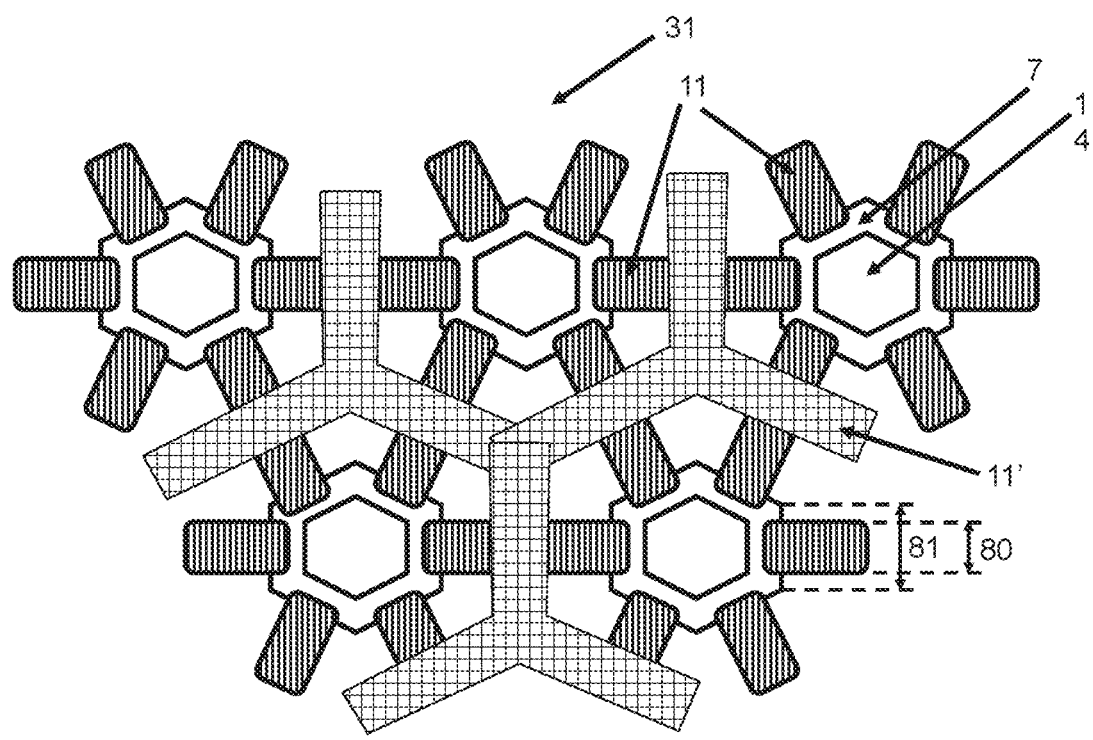
FIG. 33: shows a top view of a twenty-second exemplary embodiment comprising a multi cell arrangement of hexagonal transistor cells.
Figure 34:
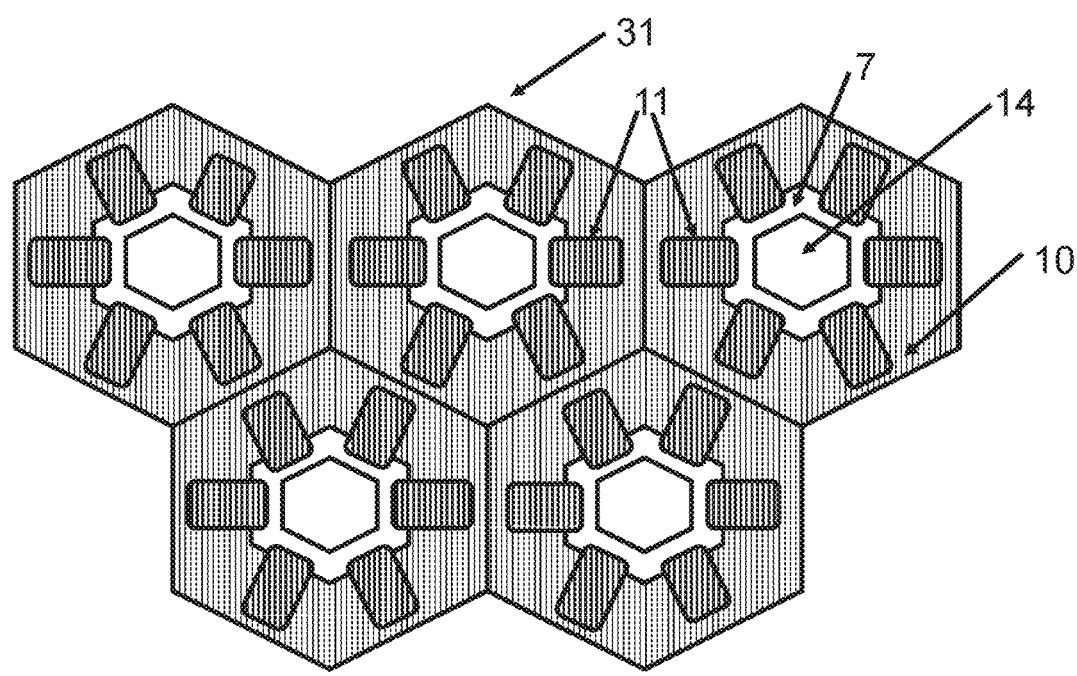
FIG. 34: shows a top view of a twenty-third exemplary embodiment comprising a multi cell arrangement of hexagonal transistor cells.

FIGS. 30, 31 and 34 show further exemplary embodiments of multi-cell arrangements of octagonal or hexagonal transistor cells, interconnected by a planar second electrode 10 which substantially covers the regions in between the active cells. Due to the presence of the second gate electrode 10, there will be additional planar MOS channels 15 formed at the emitter side 31 in the first base layer 9. However, the gate-collector capacitance of the device may be increased due to the large area of the second gate electrode 10. It is nonetheless understood, that the second gate electrode 10 does not have to be a layer uniformly covering the emitter side 31 of the device, as depicted in FIG. 30, or 32 or 34. The second gate electrode 10 can also be omitted in regions where it does not overlap significantly with, for example, the first base layer 9.

In order to address possible short circuit operating conditions, it may also be possible to structure the transistor active cells 1 in such a manner, that the source region 7 is omitted in between multiple adjacent trench regions of first gate electrodes 11.

A further embodiment is a reverse conducting type of power semiconductor, wherein the collector layer 2 may be formed of alternating regions of p doped 6 and n doped 18 material. In this case, there will be a diode formed in parallel with the transistor in the same cell. The performance of the diode part will be heavily influenced by the emitter side structure of the transistor cell. With the embodiments disclosed in this patent application, it will be possible to better control the trade-off performance curves for the diode part, without negatively affecting the transistor part.

In a further embodiment, an n doped enhancement layer 17 may be arranged between the drift layer 4 and the first base layer 9, with the purpose of further enhancing the electron-hole plasma concentration at the emitter side 31. To achieve this effect, the doping of the layer 17 may be larger than the doping of the drift layer 4.

The second gate electrode 10 may be grounded or left floating. Consequently, no inversion layer can be formed at the emitter side 31 of the first base layer 9, under the second gate electrode 10. Because there is no electrical connection to the first gate electrodes 11, the operation of the first gate electrodes 11 remains independent from second gate electrodes 10, and follows the same phenomenon as a described previously, with the electrons flowing along the lateral walls 40 of the trench regions when the voltage applied to the gate electrodes 11 is greater than a threshold value.

In other embodiments, the material of the drift layer may be different than Silicon, for example it may be made of Silicon Carbide, Gallium Nitride, Gallium Oxide, Zinc Oxide or the like. In this case, the same embodiments as described above can be applied, however the specific dimensions and dopant profiles have to be adjusted accordingly by means known to those expert in the field. More specifically, if the drift layer is made of Silicon material, the trench regions may extend vertically to a depth approximately in a range from about 2 μm to about 7 μm. The trench width may range from about 3 μm to about 0.5 μm. However, if the drift layer comprises wide band gap materials such as Silicon Carbide or Gallium Nitride or Gallium Oxide or Zinc Oxide, the depth and width of the trench recesses have different dimensions than above, for example the depth can be also smaller than 2 μm.

In addition, for some of the additional embodiments comprising wide bandgap materials, the buffer layer 5 and the collector layer 6 may be omitted, in particular if the power semiconductor device is a MOSFET device with unipolar conduction i.e., majority charge carriers only.

Furthermore, in other embodiments it may be possible that the power semiconductor is made of a multitude of different transistor cells, but not all cells may be of the same design. For example, the power semiconductor device may be formed with some transistor cells having the first exemplary embodiment, and with some transistor cells having a different design covered in the previous embodiments, or in the prior art.

It is also possible to apply the invention to power semiconductor devices, in which the conductivity type of all layers is reversed, i.e., with a lightly p doped drift layer etc.

In most applications, power semiconductors are not used in bare die form. Therefore, in a further embodiment to this patent application, multiple power semiconductors of any of the previous embodiments may be mounted as single or parallel connected chips on a substrate using techniques such as soldering or sintering. An additional enclosure, protective layers, sensors, and internal/external metal connectors are usually added to form the basis for a power module, with the role of protecting the power semiconductors from damaging environmental factors (mechanical pressure, humidity, high temperatures, electrical discharges etc).

The power modules may be subsequently used in power converters that control the flow of electrical current between a source and a load. The source may be a DC type battery for example, and the load may be an electrical motor. Typical converter topologies that could make use of semiconductor devices with transistor cells according to any previous exemplary embodiments are two-, three- or other multi-level converters, H-bridge or resonant switching.

REFERENCE LIST

1: inventive power semiconductor device cell layout
3: emitter metallization (electrode)
31: emitter side
2: collector metallization (electrode)
21: collector side
4: drift layer, substrate
5: buffer layer
6: collector layer
7: n source layer
8: p second base layer
9: p first base layer
10: second gate electrode, electrically conductive layer
10': only when the second gate electrode is formed, represents the first gate electrode regions not covered by the second gate electrode
11: first gate electrode, electrically conductive layer
11': gate runner, electrically conductive layer
11": planar extension of the first gate electrode, electrically conductive layer
12: second insulating layer
12': first insulating layer
13: third insulating layer
14: emitter contact opening
15: horizontal channel for planar gate
16: vertical channel for trench gate
17: enhancement layer
18: collector shorts
40: active lateral trench wall i.e., inversion layer is formed, and there is contact with the source region
50: separation region between the singular point 100 and the highest doping concentration region in the first base layer (in the Y dimension)
60: separation region between the singular point 100 and the first edge of the second base layer (in the Y dimension)
80: trench width
81: width of transistor cell side
90: first end trench wall
90': second end trench wall
100: singular point close to the edge of the mask for source region ion implantation, where the surface doping concentration in the source region reaches a maximum value
200, 201: planar MOS cell power semiconductor devices (prior art)
300, 301, 302: trench MOS cell power semiconductor devices (prior art)

The invention claimed is:

1. A semiconductor transistor cell with a first surface and a second surface, wherein a first contact electrode is operatively connected to the first surface and a second contact electrode is operatively connected to the second surface, comprising:
a drift layer of a first conductivity type located between the first surface and the second surface;
a source region of the first conductivity type operatively connected to the first contact electrode, with a doping concentration greater than a doping concentration of the drift layer, with edges defined by a closed form in a top plane view;
a first base layer of a second conductivity type, opposite of the first conductivity type, extending in the drift layer below the source region, and extending in the top plane view beyond the edges of the source region;
a second base layer of the second conductivity type embedded within the first base layer and extending in the drift layer under the source region, having a doping concentration greater than a doping concentration of the first base layer, operatively connected to the first contact electrode via a contact opening;
a plurality of trench regions with trench recesses formed on the first surface of the drift layer, each trench recess comprising a first gate electrode and a first insulating layer, the first insulating layer electrically insulating the first gate electrode from the second base layer, the source region and the drift layer; wherein at least one trench region abuts the source region;
a second insulating layer on the first surface of the drift layer in contact with the first base layer, the source region and the drift layer, wherein a singular point is defined on each lateral trench wall of each trench region abutting the source region at the intersection between the first surface of the source region, and the edge of the second insulating layer abutting the said lateral trench wall;
a gate runner on the first surface of the drift layer, in contact with at least one of a plurality of first gate electrodes; and
a third insulating layer, electrically insulating the first contact electrode from the first gate electrodes and the gate runner;
wherein the first insulating layer and the first base layer are configured to form MOS channels only on those respective lateral trench walls of the plurality of trench regions abutting the source region wherein a width of each of the MOS channels is equivalent to a segment of a circle arranged on the lateral trench walls of the plurality of trench regions and centered on the singular point adjacent to the respective lateral trench walls,
wherein in the top plane view, the source region, the first base layer and the second base layer are shaped as polygons and the plurality of trench regions extend longitudinally:
at an angle of 90 degrees with respect to the sides of the said polygons; or
along the diagonals and intersecting the corners of the said polygons;
wherein the gate runner is formed:
with trench recesses embedding a conductive electrode and an insulating layer, or as a planar conductive electrode on the first surface and separated from the drift layer by an insulating layer.

2. The semiconductor transistor cell according to claim 1, wherein the first surface and the second surface are on opposite sides of the drift layer.

3. The semiconductor transistor cell according to claim 1, wherein on the lateral trench walls of each trench region abutting the source region a position of a first edge of the second base layer is aligned with the position of the singular points in the top plane view.

4. The semiconductor transistor cell according to claim 1, wherein on the lateral trench walls of each trench region abutting the source region a first edge of the second base layer and the singular point are spaced apart by a separation region in the top plane view.

5. The semiconductor transistor cell according to claim 4, wherein at least one of the plurality of trench regions does not abut the second base layer.

6. The semiconductor transistor cell according to claim 1, wherein the first base layer is uniformly arranged on the drift layer, such that the drift layer is not in direct contact with the second insulating layer at the first surface.

7. The semiconductor transistor cell according to claim 1, wherein a first end wall of the trench regions is arranged within the source region, and a second end wall of the trench regions is located within an adjacent source region, the first base layer, and/or the drift layer.

8. The semiconductor transistor cell according to claim 1, wherein the gate runner abuts or partially overlaps the first base layer.

9. The semiconductor transistor cell according to claim 1 wherein the gate runner is formed as a trench recess embedding a conductive electrode and an insulating layer, and wherein the trench recess is substantially embedded in the first base layer.

10. The semiconductor transistor cell according to claim 1, wherein the edges of the polygons shaping the source region is substantially similar to the width of the trench regions.

11. The power semiconductor transistor cell according to claim 1, wherein in the top plane view:
the plurality of trench regions are shaped with respective stripes;
the first base layer, the source region and the second base layer are shaped with respective elongated polygons forming a right angle with the respective stripes of the trench regions; or
the first base layer, the source region and the second base layer are shaped with respective elongated polygons;
the plurality of trench regions are shaped with respective stripes forming right angle with the respective elongated polygons of the first base layer, the source region and the second base layer; and
the respective elongated polygons of the first base layers, source region and second base layer are interrupted by the respective stripes of the trenches; or
the respective stripes of the plurality of trench regions are interrupted by the respective elongated polygons of the first base layer, the source region and the second base layer.

12. The semiconductor transistor cell according to claim 1, wherein at least one of the first gate electrodes is electrically connected to the first contact electrode.

13. The semiconductor transistor cell according to claim 1, wherein at least one of the first gate electrodes is electrically floating.

14. The semiconductor transistor cell according to claim 1, further comprising at least one of:

a buffer layer of the first conductivity type located between the drift layer and the second surface, wherein a doping concentration of the buffer layer is greater than the doping concentration of the drift layer; and
a collector layer of the second conductivity type located between the drift layer and the second surface.

15. The semiconductor transistor cell according to claim 14, wherein the semiconductor is a reverse conducting power semiconductor transistor cell and the collector layer further comprises alternating first and second type conductivity regions located between the buffer layer and the second contact electrode.

16. The semiconductor transistor cell according to claim 1, wherein an additional layer of the first conductivity type separates the drift layer and the first base layer, and wherein a doping concentration of the additional layer is greater than the doping concentration of the drift layer.

17. The semiconductor transistor cell according to claim 1, wherein at least the drift layer is formed with a wide bandgap material.

18. A semiconductor transistor cell with a first surface and a second surface, wherein a first contact electrode is operatively connected to the first surface and a second contact electrode is operatively connected to the second surface, comprising:
a drift layer of a first conductivity type located between the first surface and the second surface;
a source region of the first conductivity type operatively connected to the first contact electrode, with a doping concentration greater than the doping concentration of the drift layer, with edges defined by a closed form in a top plane view;
a first base layer of a second conductivity type, opposite of the first conductivity type, extending in the drift layer below the source region, and extending in the top plane view beyond the edges of the source region;
a second base layer of the second conductivity type embedded within the first base layer and extending in the drift layer under the source region, having a doping concentration greater than a doping concentration of the first base layer, operatively connected to the first contact electrode via a contact opening;
a plurality of trench regions with trench recesses formed on the first surface of the drift layer, each trench recess comprising a first gate electrode and a first insulating layer, the first insulating layer electrically insulating the first gate electrode from the second base layer, the source region and the drift layer; wherein at least one trench region abuts the source region;
a second gate electrode on the first surface of the drift layer overlapping the plurality of said trench regions, contacting at least one of the first gate electrodes at the cross points thereof, and insulated from the drift layer, the first base layer and the source region by a second insulating layer;
wherein a singular point is defined on the first surface of the source region, at the intersection between the first surface of the source region, a lateral trench wall of a trench region abutting the source region, and the edge of the second insulating layer abutting the said lateral trench wall,
a third insulating layer, electrically insulating the first contact electrode from the first gate electrodes and the second gate electrode;
wherein the first insulating layer and the first base layer are configured to form a MOS channels on those respective lateral trench walls of the plurality of trench regions abutting the source region, wherein a width of each of the MOS channels is equivalent to a segment of a circle arranged on the respective lateral trench walls, wherein the second insulating layer and the first base layer are configured to form another MOS channel at the first surface of the first base layer regions overlapping with the second gate electrode, and wherein in the top plane view the source region, the first base layer and the second base layer are shaped as polygons and the plurality of trench regions extend longitudinally at an angle of 90 degrees with respect to the sides of the polygons; or along the diagonals and intersecting the corners of the polygons.

19. The semiconductor transistor cell according to claim 18, wherein an additional gate runner is formed as a conductive electrode, and an insulating layer layered between the drift layer and the second insulating layer, wherein the conductive electrode contacts those first gate electrodes that are disconnected from the second gate electrode.

\* \* \* \* \*